US009040851B2

(12) United States Patent
Krumpelman

(10) Patent No.: US 9,040,851 B2
(45) Date of Patent: May 26, 2015

(54) KEYCAP ASSEMBLY WITH AN INTERACTIVE SPRING MECHANISM

(71) Applicant: SYNAPTICS INCORPORATED, Santa Clara, CA (US)

(72) Inventor: Douglas M. Krumpelman, Hayden, ID (US)

(73) Assignee: Synaptics Incorporated, San Jose, CA (US)

( * ) Notice: Subject to any disclaimer, the term of this patent is extended or adjusted under 35 U.S.C. 154(b) by 170 days.

(21) Appl. No.: 13/802,955

(22) Filed: Mar. 14, 2013

(65) Prior Publication Data
US 2014/0034469 A1 Feb. 6, 2014

Related U.S. Application Data

(60) Provisional application No. 61/680,261, filed on Aug. 6, 2012.

(51) Int. Cl.
*H01H 9/26* (2006.01)
*H01H 13/85* (2006.01)
*H03K 17/96* (2006.01)
*H03K 17/98* (2006.01)

(52) U.S. Cl.
CPC ............. *H01H 13/85* (2013.01); *H03K 17/962* (2013.01); *H03K 17/98* (2013.01); *H01H 2221/044* (2013.01)

(58) Field of Classification Search
USPC .......... 200/5 A, 341, 344, 345, 533; 335/202; 345/168; 341/22; 400/490, 491.2

IPC ...................... H01H 2221/058,13/85, 2013/525
See application file for complete search history.

(56) References Cited

U.S. PATENT DOCUMENTS

| 3,886,341 A | 5/1975 | Forrest |
| 3,938,642 A | 2/1976 | Van Rumpt et al. |
| 4,039,068 A | 8/1977 | Giorza et al. |
| 4,056,701 A | 11/1977 | Weber |

(Continued)

FOREIGN PATENT DOCUMENTS

| CN | 102035525 A | 4/2011 |
| CN | 102832921 A | 12/2012 |

(Continued)

OTHER PUBLICATIONS

"Elastomers: Powerful Polymer", Retrieved from <http://appliancedesign.com/copyright/>, (Jun. 2006),5 pages.

(Continued)

*Primary Examiner* — Vanessa Girardi
(74) *Attorney, Agent, or Firm* — Osha Liang LLP

(57) ABSTRACT

A touchsurface assembly comprises a base, a pressable touchsurface, and a deflectable spring. The pressable touchsurface is configured to move between an unpressed position and a pressed position relative to the base. The deflectable spring comprises a fixed portion and a contact portion. The contact portion is configured to contact a spring guiding profile. As the touchsurface moves from the unpressed position to the pressed position, the contact portion physically interacts with different sections of the spring guiding profile. This interaction causes different deflections of the deflectable spring and produces reaction forces that resist keycap motion toward the pressed position and bias the keycap toward the unpressed position.

25 Claims, 20 Drawing Sheets

(56) References Cited

U.S. PATENT DOCUMENTS

| | | |
|---|---|---|
| 4,265,557 A | 5/1981 | Runge |
| 4,294,555 A | 10/1981 | Galaske et al. |
| 4,326,195 A | 4/1982 | Seki et al. |
| 4,334,280 A | 6/1982 | Mcdonald |
| 4,403,123 A | 9/1983 | Shek |
| 4,480,162 A | 10/1984 | Greenwood |
| D278,239 S | 4/1985 | Felix et al. |
| D284,574 S | 7/1986 | Fischer |
| D292,801 S | 11/1987 | Davis et al. |
| 4,735,520 A | 4/1988 | Suzuki et al. |
| 4,786,766 A | 11/1988 | Kobayashi |
| 4,885,565 A | 12/1989 | Embach |
| D312,623 S | 12/1990 | Carter et al. |
| 5,053,591 A | 10/1991 | Theurer |
| 5,121,091 A | 6/1992 | Fujiyama |
| 5,189,390 A | 2/1993 | Fagard |
| 5,212,473 A | 5/1993 | Louis |
| 5,239,152 A | 8/1993 | Caldwell et al. |
| 5,329,278 A | 7/1994 | Dombroski |
| 5,418,530 A | 5/1995 | Moore et al. |
| 5,463,195 A | 10/1995 | Watanabe et al. |
| 5,523,730 A | 6/1996 | Van Zeeland |
| 5,575,576 A | 11/1996 | Roysden, Jr. |
| 5,626,223 A | 5/1997 | Lee |
| 5,666,096 A | 9/1997 | Van Zeeland |
| 5,667,061 A | 9/1997 | Lee |
| 5,763,842 A | 6/1998 | Tsai et al. |
| 5,767,463 A | 6/1998 | Gandre |
| 5,828,015 A | 10/1998 | Coulon |
| 5,867,082 A | 2/1999 | Van Zeeland |
| 5,902,972 A | 5/1999 | Nestor et al. |
| 5,921,382 A | 7/1999 | Retter |
| 5,934,454 A | 8/1999 | Burleson et al. |
| 5,973,670 A | 10/1999 | Barber et al. |
| 5,977,867 A | 11/1999 | Blouin |
| 5,977,888 A | 11/1999 | Fujita et al. |
| 5,982,304 A | 11/1999 | Selker et al. |
| 6,039,258 A | 3/2000 | Durbin et al. |
| 6,046,730 A | 4/2000 | Bowen et al. |
| 6,067,081 A | 5/2000 | Hahlganss et al. |
| 6,069,545 A | 5/2000 | Van Zeeland |
| 6,069,552 A | 5/2000 | Van Zeeland |
| 6,118,435 A | 9/2000 | Fujita et al. |
| 6,130,593 A | 10/2000 | Van Zeeland |
| 6,166,662 A | 12/2000 | Chuang |
| 6,218,966 B1 | 4/2001 | Goodwin et al. |
| 6,219,034 B1 | 4/2001 | Elbing et al. |
| 6,262,646 B1 | 7/2001 | Van Zeeland |
| 6,262,717 B1 | 7/2001 | Donohue et al. |
| 6,305,071 B1 | 10/2001 | Van Zeeland |
| 6,328,489 B1 | 12/2001 | Chi-Pin |
| 6,369,692 B1 | 4/2002 | Van Zeeland |
| 6,369,803 B2 | 4/2002 | Brisebois et al. |
| 6,373,463 B1 | 4/2002 | Beeks |
| 6,375,372 B1 | 4/2002 | Tsau |
| 6,392,515 B1 | 5/2002 | Van Zeeland et al. |
| 6,400,246 B1 | 6/2002 | Hill et al. |
| 6,429,846 B2 | 8/2002 | Rosenberg et al. |
| 6,430,023 B1 | 8/2002 | Suzuki |
| 6,455,794 B2 | 9/2002 | Sato et al. |
| 6,466,118 B1 | 10/2002 | Van Zeeland et al. |
| 6,509,818 B2 | 1/2003 | Van Zeeland |
| 6,542,058 B2 | 4/2003 | Van Zeeland |
| 6,556,112 B1 | 4/2003 | Van Zeeland et al. |
| 6,563,434 B1 | 5/2003 | Olodort et al. |
| 6,566,616 B1 | 5/2003 | Ha |
| 6,657,139 B2 | 12/2003 | Hasunuma |
| 6,677,843 B1 | 1/2004 | Monroe et al. |
| 6,693,626 B1 | 2/2004 | Rosenberg |
| 6,723,935 B1 | 4/2004 | Watanabe |
| 6,723,937 B2 | 4/2004 | Englemann et al. |
| 6,750,415 B2 | 6/2004 | Yamagami |
| 6,761,494 B2 | 7/2004 | Hsu et al. |
| 6,819,990 B2 | 11/2004 | Ichinose |
| 6,822,635 B2 | 11/2004 | Shahoian et al. |
| 6,880,994 B2 | 4/2005 | Takahashi |
| 6,911,901 B2 | 6/2005 | Bown |
| 6,937,124 B1 | 8/2005 | Nakamura et al. |
| 6,939,065 B2 | 9/2005 | Roysden, Jr. |
| 6,940,030 B2 | 9/2005 | Takeda et al. |
| 6,982,617 B2 | 1/2006 | Brilon et al. |
| D527,004 S | 8/2006 | Yen |
| 7,106,305 B2 | 9/2006 | Rosenberg |
| 7,113,177 B2 | 9/2006 | Franzen |
| 7,119,798 B2 | 10/2006 | Yoshikawa et al. |
| 7,148,789 B2 | 12/2006 | Sadler et al. |
| 7,166,795 B2 | 1/2007 | Lengeling |
| 7,182,691 B1 | 2/2007 | Schena |
| 7,196,688 B2 | 3/2007 | Schena |
| 7,215,329 B2 | 5/2007 | Yoshikawa et al. |
| 7,224,106 B2 | 5/2007 | Pei et al. |
| 7,227,537 B2 | 6/2007 | Nakayama et al. |
| 7,269,484 B2 | 9/2007 | Hein |
| 7,292,227 B2 | 11/2007 | Fukumoto et al. |
| 7,312,791 B2 | 12/2007 | Hoshino et al. |
| 7,324,094 B2 | 1/2008 | Moilanen et al. |
| 7,336,266 B2 | 2/2008 | Hayward et al. |
| 7,339,572 B2 | 3/2008 | Schena |
| 7,342,573 B2 | 3/2008 | Ryynaenen |
| 7,375,656 B2 | 5/2008 | Mueller et al. |
| 7,385,308 B2 | 6/2008 | Yerdon et al. |
| 7,400,319 B2 | 7/2008 | Nakayama et al. |
| 7,450,110 B2 | 11/2008 | Shahoian et al. |
| 7,525,415 B2 | 4/2009 | Yatsu et al. |
| 7,548,232 B2 | 6/2009 | Shahoian et al. |
| 7,567,232 B2 | 7/2009 | Rosenberg |
| 7,569,786 B2 | 8/2009 | Spies |
| 7,573,460 B2 | 8/2009 | Strawn et al. |
| 7,579,758 B2 | 8/2009 | Maruyama et al. |
| 7,589,607 B2 | 9/2009 | Rochon et al. |
| 7,592,901 B2 | 9/2009 | Furusho |
| 7,592,999 B2 | 9/2009 | Rosenberg et al. |
| 7,602,384 B2 | 10/2009 | Rosenberg et al. |
| 7,607,087 B2 | 10/2009 | Prados |
| 7,701,440 B2 | 4/2010 | Harley |
| 7,855,715 B1 | 12/2010 | Bowen |
| 7,868,515 B2 | 1/2011 | Krochmal et al. |
| 7,898,440 B2 | 3/2011 | Chen |
| 7,969,288 B2 | 6/2011 | Braun et al. |
| 7,982,720 B2 | 7/2011 | Rosenberg et al. |
| 8,031,181 B2 | 10/2011 | Rosenberg et al. |
| 8,059,105 B2 | 11/2011 | Rosenberg et al. |
| 8,094,130 B2 | 1/2012 | Griffin et al. |
| 8,199,033 B2 | 6/2012 | Peterson et al. |
| 8,203,531 B2 | 6/2012 | Peterson et al. |
| 8,217,289 B2 | 7/2012 | Liu |
| 8,222,799 B2 | 7/2012 | Polyakov et al. |
| 8,232,969 B2 | 7/2012 | Grant et al. |
| 8,248,277 B2 | 8/2012 | Peterson et al. |
| 8,248,278 B2 | 8/2012 | Schlosser et al. |
| 8,274,478 B2 | 9/2012 | Bowen |
| 8,309,870 B2 | 11/2012 | Peterson et al. |
| 8,310,351 B2 | 11/2012 | Krahenbuhl et al. |
| 8,310,444 B2 | 11/2012 | Peterson et al. |
| 8,451,426 B2 | 5/2013 | Iino |
| 8,648,737 B1 | 2/2014 | Bowen |
| 8,674,941 B2 | 3/2014 | Casparian et al. |
| 2001/0002648 A1 | 6/2001 | Van Zeeland |
| 2002/0054060 A1 | 5/2002 | Schena |
| 2002/0084721 A1 | 7/2002 | Walczak |
| 2002/0149561 A1 | 10/2002 | Fukumoto et al. |
| 2003/0067449 A1 | 4/2003 | Yoshikawa et al. |
| 2003/0209131 A1 | 11/2003 | Asahi |
| 2003/0210233 A1 | 11/2003 | Frulla |
| 2004/0252104 A1 | 12/2004 | Nakamura et al. |
| 2005/0017947 A1 | 1/2005 | Shahoian et al. |
| 2005/0089356 A1 | 4/2005 | Jung-Tsung |
| 2005/0157893 A1 | 7/2005 | Pelrine et al. |
| 2005/0204906 A1 | 9/2005 | Lengeling |
| 2005/0237309 A1 | 10/2005 | Sharma |
| 2006/0232559 A1 | 10/2006 | Chien et al. |
| 2006/0256075 A1 | 11/2006 | Anastas et al. |
| 2006/0261983 A1 | 11/2006 | Griffin et al. |
| 2007/0031097 A1 | 2/2007 | Heikenfeld et al. |

(56) References Cited

U.S. PATENT DOCUMENTS

| | | |
|---|---|---|
| 2007/0080951 A1 | 4/2007 | Maruyama et al. |
| 2007/0091070 A1 | 4/2007 | Larsen et al. |
| 2007/0146317 A1 | 6/2007 | Schena |
| 2007/0146334 A1 | 6/2007 | Inokawa |
| 2007/0152974 A1 | 7/2007 | Kim et al. |
| 2007/0165002 A1 | 7/2007 | Wassingbo |
| 2007/0193436 A1 | 8/2007 | Chu |
| 2007/0205988 A1 | 9/2007 | Gloyd et al. |
| 2007/0234887 A1 | 10/2007 | Sawada et al. |
| 2007/0234890 A1 | 10/2007 | Yamashita |
| 2007/0236449 A1 | 10/2007 | Lacroix et al. |
| 2007/0236450 A1 | 10/2007 | Colgate et al. |
| 2008/0007529 A1 | 1/2008 | Paun et al. |
| 2008/0042980 A1 | 2/2008 | Bowen |
| 2008/0062015 A1 | 3/2008 | Bowen |
| 2008/0083314 A1 | 4/2008 | Hayashi et al. |
| 2008/0084384 A1 | 4/2008 | Gregorio et al. |
| 2008/0087476 A1 | 4/2008 | Prest et al. |
| 2008/0092720 A1 | 4/2008 | Yamashita et al. |
| 2008/0100568 A1 | 5/2008 | Koch et al. |
| 2008/0165127 A1 | 7/2008 | Eom |
| 2008/0289952 A1 | 11/2008 | Pelrine et al. |
| 2008/0302647 A1 | 12/2008 | Villain et al. |
| 2008/0303782 A1 | 12/2008 | Grant et al. |
| 2009/0002205 A1 | 1/2009 | Klinghult et al. |
| 2009/0072662 A1 | 3/2009 | Sadler et al. |
| 2009/0073128 A1 | 3/2009 | Marsden |
| 2009/0079593 A1 | 3/2009 | Yamakawa et al. |
| 2009/0088220 A1 | 4/2009 | Persson |
| 2009/0128501 A1 | 5/2009 | Lazaridis et al. |
| 2009/0178913 A1 | 7/2009 | Peterson et al. |
| 2009/0189790 A1 | 7/2009 | Peterson et al. |
| 2009/0189873 A1 | 7/2009 | Peterson et al. |
| 2009/0210568 A1 | 8/2009 | Peterson et al. |
| 2009/0231277 A1 | 9/2009 | Peterson et al. |
| 2009/0255793 A1 | 10/2009 | Krochmal et al. |
| 2010/0171715 A1 | 7/2010 | Peterson et al. |
| 2010/0231423 A1 | 9/2010 | Yang |
| 2010/0245231 A1 | 9/2010 | Aramaki |
| 2010/0253629 A1 | 10/2010 | Orsley |
| 2010/0259481 A1 | 10/2010 | Oh |
| 2010/0309130 A1 | 12/2010 | Zhao et al. |
| 2010/0321301 A1 | 12/2010 | Casparian et al. |
| 2010/0328251 A1 | 12/2010 | Sinclair |
| 2011/0025607 A1 | 2/2011 | Bowen |
| 2011/0095919 A1 | 4/2011 | Ostermoller et al. |
| 2011/0096013 A1 | 4/2011 | Krumpelman et al. |
| 2011/0128239 A1 | 6/2011 | Polyakov et al. |
| 2011/0203912 A1 | 8/2011 | Niu |
| 2011/0205161 A1 | 8/2011 | Myers et al. |
| 2011/0227762 A1 | 9/2011 | Bowen |
| 2011/0227872 A1 | 9/2011 | Huska et al. |
| 2011/0234494 A1 | 9/2011 | Peterson et al. |
| 2012/0019445 A1 | 1/2012 | Liu |
| 2012/0043191 A1 | 2/2012 | Kessler et al. |
| 2012/0092263 A1 | 4/2012 | Peterson et al. |
| 2012/0119996 A1 | 5/2012 | Wu et al. |
| 2012/0169603 A1 | 7/2012 | Peterson et al. |
| 2012/0268384 A1 | 10/2012 | Peterson et al. |
| 2012/0299832 A1 | 11/2012 | Peterson et al. |
| 2013/0082932 A1 | 4/2013 | Gluckstad et al. |
| 2013/0093681 A1 | 4/2013 | Hsu |
| 2013/0135207 A1 | 5/2013 | Neil et al. |
| 2013/0314325 A1 | 11/2013 | Furukawa |
| 2013/0342494 A1 | 12/2013 | Feng |
| 2014/0001021 A1 | 1/2014 | Zhang |
| 2014/0034468 A1 | 2/2014 | Krumpelman et al. |
| 2014/0055363 A1 | 2/2014 | Meierling et al. |

FOREIGN PATENT DOCUMENTS

| | | |
|---|---|---|
| CN | 202694270 U | 1/2013 |
| DE | 19704253 A | 8/1998 |
| DE | 10126670 A1 | 12/2002 |
| DE | 2005002417 A | 4/2005 |
| DE | 2004005501 A | 8/2005 |
| EP | 0278916 A | 8/1988 |
| EP | 1548776 A | 6/2005 |
| EP | 2287873 A | 2/2011 |
| JP | 2000348562 A | 12/2000 |
| JP | 2007173087 A | 7/2007 |
| JP | 2011233406 A | 11/2011 |

OTHER PUBLICATIONS

"Haptic Touch Technology", Pacinian,(Nov. 2007),2 pages.
"Haptics: Learning Through Touch", Retrieved from <http://ced.ncsu.edu/nanoscale/haptics.htm>, (2004),5 pages.
"International Search Report and Written Opinion", Application No. PCT/US2010/020380, (Apr. 12, 2010),10 pages.
"Nanoactuators Based on Electrostatic Forces on Dielectrics", Retrieved from <http://www.nasatech.com/Briefs/Apr05/NPO30747.html>on Nov. 28, 2005, NASA's Jet Propulsion Laboratory, Pasadena, CA,4 pages.
New SRI International sSpin-Off, Artificial Muscle, Inc., Secure Series a Funding from Leading VC Firms, Retrieved from <http://www.sri.com/news/releases/05-03-04.html> on Jan. 30, 2008, SRI International Spin Offs Artificial Muscle, Inc,(May 2004),2 pages.
"Non-Final Office Action mailed Dec. 9, 2011", U.S. Appl. No. 12/580,002, 21 pages.
"Proposed Experiment Protocol and Details", Retrieved from <http://bdml.stanford.edu/twiki/bin/view/Haptics/ProposedExperi0mentPr- otocolAndDetails>, 5 pages.
"Tactile Perception and Design", Retrieved from http://www.tireesias.org/reports.tpd2.htm on Apr. 4, 2006, 10 pages.
"Touch and Haptics", 2004 IEEE/ RSJ International Conference on Intelligent Robots and Systems, (Sep. 28, 2004),32 pages.
"Touch-Hapsys", Retrieved from <http://www.touch-hapsys.org>, 2 pages.
Ashley, Steven "Artificial Muscles", Scientific American, Available at <www.sciam.com>,(Oct. 2003),pp. 53-59.
Bar-Cohen, Y. "Electroactive Polymer (EAP) Actuators as Artificial Muscles—Reality, Potential and Challenges", SPIE Press, (Mar. 18, 2004),pp. 26 and 548-550.
Bar-Cohen, Yoseph "Electric Flex", IEEE Spectrum Online, (Jun. 2004),6 pages.
Bar-Cohen, Yoseph "Electroactive Polymers as Artificial Muscles—Capabilities, Potentials and Challenges", Robotics 2000, Available at <www.spaceandrobotics>,(Feb. 28-Mar. 2, 2000),pp. 1-8.
Bar-Cohen, Yoseph "Electroactive Polymers", Retrieved from <http://electrochem.cwru.edu/ed/encycl/>, Electrochemistry Encyclopedia,(Dec. 2004),7 pages.
Bar-Cohen, Yoseph "Low Mass Muscle Actuators (LoMMAs)", Telerobotic Task Sponsored by NASA HQ, Code S, (Oct. 23, 1997),18 pages.
Bar-Cohen, Yoseph "Worldwide Electroactive Polymers", (Artificial Muscles) Newsletter, vol. 7, No. 2, Available at <http://eap.jpl.nasa.gov>,(Dec. 2005),pp. 1-16.
Bar-Cohen, Yoseph et al., "Enabling Novel Planetary and Terrestrial Mechanisms Using Electroactive Materials at the JPL's NDEAA Lab", Retrieved from http://ndeaa.jpl.nasa.gov>, pp. 1-6.
Bark, Karlin "Functional Prototype I", Retrieved from <http://bdml.stanford.edu/twiki/bin/view/Haptics/FunctionalPrototypeI?- skin=print.pattern>, (Aug. 9, 2005),3 pages.
Beavers, Alex "Basic Concepts for Commercial Applications of Electroactive Polymer Artificial Muscle", Artificial Muscle Incorporated, Menlo Park, CA,10 pages.
Bicchi, Antonio et al., "Haptic Illusions Induced by the Tactile Flow", Interdepartmental Research Centre "E. Piaggo", University of Pisa,12 pages.
Bifano, Thomas "Parallel Plate Electrostatic Actuation for High-Resolution Deformable Mirrors", Boston University, (Aug. 19, 2004),35 pages.
Bifano, Thomas, "Parallel Plate Electrostatic Actuation for High-Resolution Deformable Mirrors", Boston University, Boston, MA, Aug. 19, 2004.

(56) References Cited

OTHER PUBLICATIONS

Biggs, James "Some Useful Information for Tactile Display Design", IEEE Transactions on Man-Machine Systems, vol. 11, No. 1,(1970),pp. 19-24.

Carpi, Federico et al., "Dielectric Elastomers as Electromechanical Transducers: Fundamentals, Materials, Devices, Models and Applications of an Emerging Elecrotactive Polymer Technology", Elsevier Ltd., (2008),12 pages.

Fontaine, Ebraheem "A Laboratory Demonstration of a Parallel Robotic Mechanism", Massachusetts Institute of Technology,(Jun. 2002),pp. 1-14.

Fukumoto, Masaki, et al, "Active Click: Tactile Feedback for Touch Panels", NTT DoCoMo Multimedia Labs, Mar. 31, 2001, 2 pages.

Gorinevsky, Dimitry "Adaptive membrane for large lightweight space telescopes", SPIE Astronomical Telescopes and Instrumentation,(2002),pp. 1-9.

Hayward, Vincent et al., "Tactile Display Device Using Distributed Lateral Skin Stretch", Proceedings of the Haptic Interfaces for Virtual Environment and Teleoperator Systems Symposium, ASME International Mechanical Engineering Congress & Exposition,(2000),pp. 1309-1314.

Hollis, Ralph "Haptics", Berkshire Encyclopedia of Human-Computer Interaction, Berkshire Publishing Group,(2004), pp. 311-316.

Jager, Edwin et al., "Microfabricating Conjugated Polymer Actuators", Science Magazine, vol. 290, www.sciencemag.org,(Nov. 24, 2000),pp. 1540-1544.

Jones, Gail et al., "A Comparison of Learning with Haptic and Visual Modalities", National Science Foundation REC-0087389,pp. 1-20.

Jones, Lynette "Human Factors and Haptic Interfaces", Department of Mechanical Engineering, Massachusetts Institute of Technology,40 pages.

Jungmann, M., et al, Miniaturised Electrostatic Tactile Display with High Structural Compliance, 2002, 6 pages.

Kajimoto, Hiroyuki et al., "Electro-Tactile Display with Tactile Primary Color Approach", Graduate School of Information and Technology, The University of Tokyo,2 pages.

MacKenzie, Scott, et al, "The Tactile Touchpad", 1997, 5 pages.

MacKenzie, Scott, et al., "A Comparison of Three Selection Techniques for Touchpads", Proceedings of the CHI'98 Conference on Human Factors in Computing Systems, pp. 336-343 New York 1998.

Mok Ha, Soon et al., "Interpenetrating Polymer Networks for High-Performance Electroelastomer Artificial Muscles", Department of Materials Science and Engineering, UCLA,pp. 1-19.

Non-Final Office Action mailed Feb. 13, 2009, U.S. Appl. No. 11/945,879.

Odell, D.L. et al., "MicroRobot Conveyance and Propulsion System Using Comb Drive and Parallel Plate Actuators: The ScuttleBot", UC Berkley,4 pages.

O'Halloran, A et al., "Materials and Technologies for Artificial Muscle: A Review for the Mechatronic Muscle Project", Topics in Bio-Mechanical Engineering, Chapter 7, Department of Electronic Engineering, National University of Ireland Galway,(2004),pp. 184-215.

Oniszczak, Aleks, "VersaPad Driver Plus Pack", 1999, 3 pages.

Pasquero, Jerome "Stimulation of the Fingertip by Lateral Skin Strech", Retrieved from <http://www.cim.mcgill.ca/.about.jay/index.sub.--files/research.htm>- ;, 5 pages.

Pasquero, Jerome "Stress: A Tactile Display Using Lateral Skin Stretch", Department of Electrical and Computer Engineering McGill University, Montreal,(Oct. 2003),75 pages.

Pasquero, Jerome "Survey on Communication Through Touch", Technical Report: TR-CIM 06.04, Center for Intelligent Machines Department of Electrical and Computer Engineering,(Jul. 2006),pp. 1-27.

Pasquero, Jerome "Tactile Display Survey", Technical Report TR-CIM 06.04,6 pages.

Pei, Qibing et al., "Multiple-Degrees-of-Freedom Electroelastomer Roll Actuators", SRI International Institute of Physics Publishing, (2004),pp. N86-N92.

Poupyrev, Ivan, et al., "Tactile Interfaces for Small Touch Screens", 2003, 4 pages.

Poupyrev, Ivan, et al., "TouchEngine: A Tactile Display for Handheld Devices", 2002, 2 pages.

Raisamo, Roope "Tactile User Interfaces", New Interaction Techniques,(Aug. 2, 2001),30 pages.

Seeger, Joseph et al., "Dynamics and Control of Parallel-Plate Actuators Beyond the Electrostatic Instability", Transducers '99 The 10th International Conference on Solid State Sensors and Actuators, (Jun. 1999),pp. 474-477.

Spires, Shelby "Artificial Strongman", Smart Business: For the New Economy, (Nov. 2000),1 page.

Srinivasan, Mandayam A., et al, "Role of Skin Biomechanics in Mechanoreceptor Response", Retrieved from <http://touchlab.mit.edu/oldresearch/currentwork/humanhaptics/roleofsk- inbiomechanics/> on Dec. 20, 2007, MIT Touch Lab, (Dec. 20, 2007),pp. 1-13.

Supplemental Notice of Allowance mailed May 20, 2010, U.S. Appl. No. 11/945,879, 5 pages.

Wagstaff, Jeremy, "A Passion for the Keys", The Wall Street Journal Online, Nov. 23, 2007, 3 pages, retrieved from the Internet at online.wsj.com/article_print/SB119578337324301744.html.

Wing, Alan et al., "Multidimensional Haptics Preliminary Report", Retrieved from <http://www.touch-hapsys.org>, (Sep. 21, 2003),pp. 1-125.

Wu, Xingtao et al., "A Generalized Capacitance-Based Model for Electrostatic Micro-Actuators", Department of Physics, New Jersey Institute of Technology, Newark, NJ, 07102-1982 Department of Mechanical Engineering, Columbia University, NY 10027, pp. 1-23.

Yang, Gi-Hun, "Novel Haptic Mouse System for Holistic Haptic Display and Potential of Vibrotactile Stimulation", Human-Robot Interaction Research Center, Korea Advanced Institute of Science and Technology, 2005, 17 pages.

Zou, Jun et al., "Design of a Wide Turning Range Micromachined Turnable Capacitor for Wireless Communications", First IEEE Electro/Information Technology Conference, Jun. 8-11, Chicago, IL, 2000, 6 pages.

Non-Final Office Action mailed May 14, 2012, U.S. Appl. No. 13/323,292, 19 pages.

Final Office Action mailed Aug. 1, 2012 for U.S. Appl. No. 12/580,002, 23 pages.

$F_1$: Peak Force
$F_2$: Contact Force
Snap Ratio = $(F_1-F_2)/(F_1)$

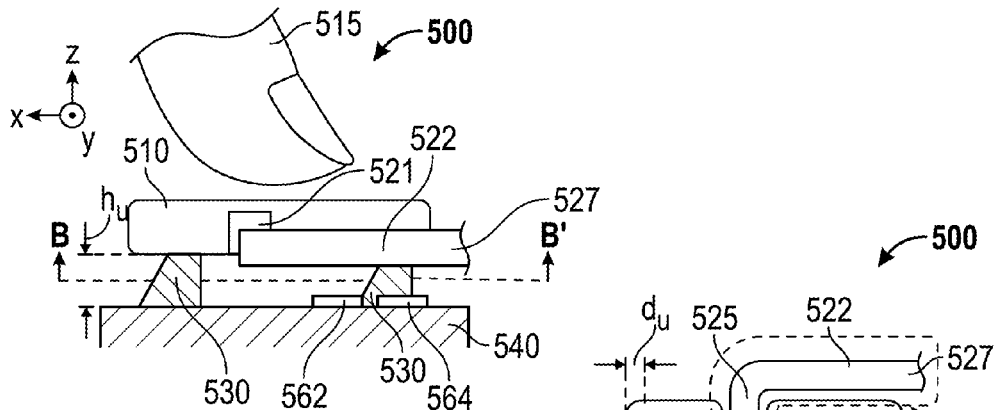
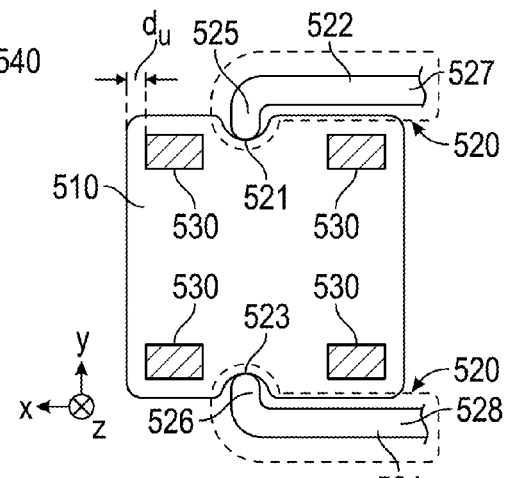
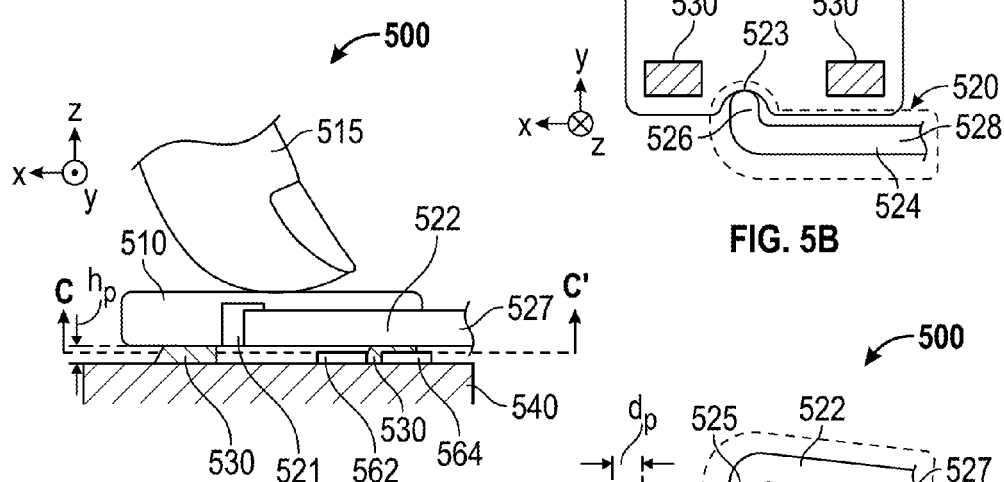
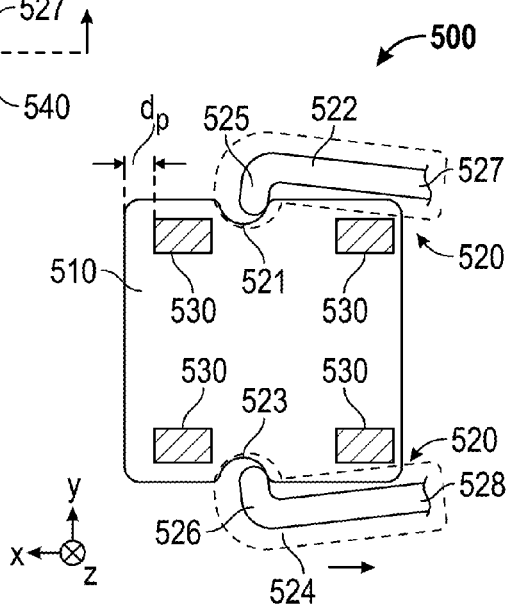
FIG. 5A
FIG. 5B
FIG. 5C
FIG. 5D

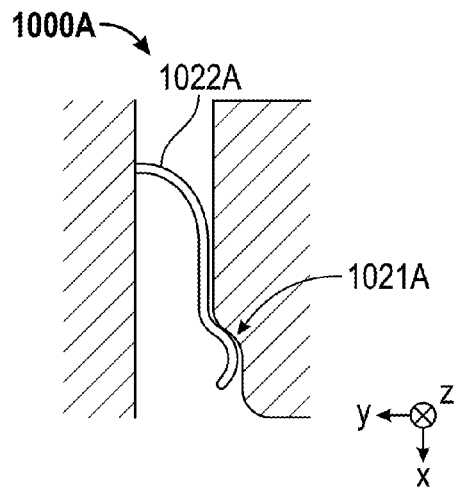
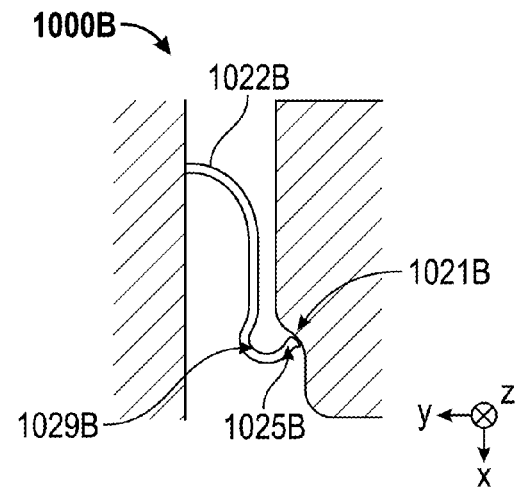
FIG. 10A　　　　　　　　FIG. 10B
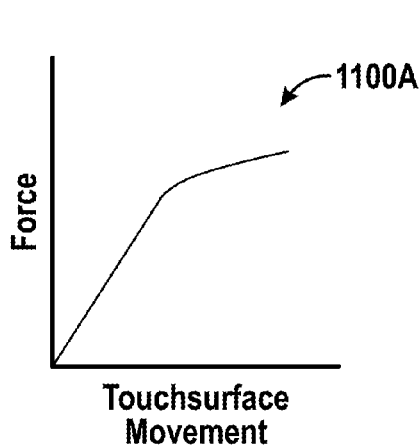
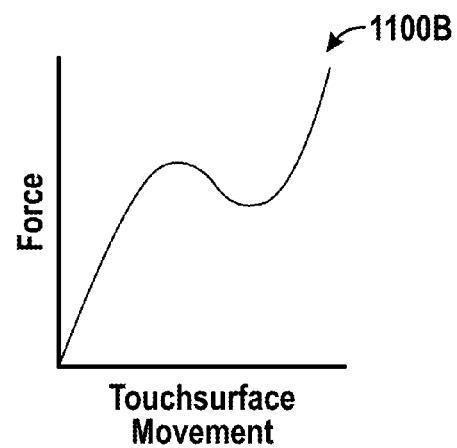
FIG. 11A　　　　　　　　FIG. 11B

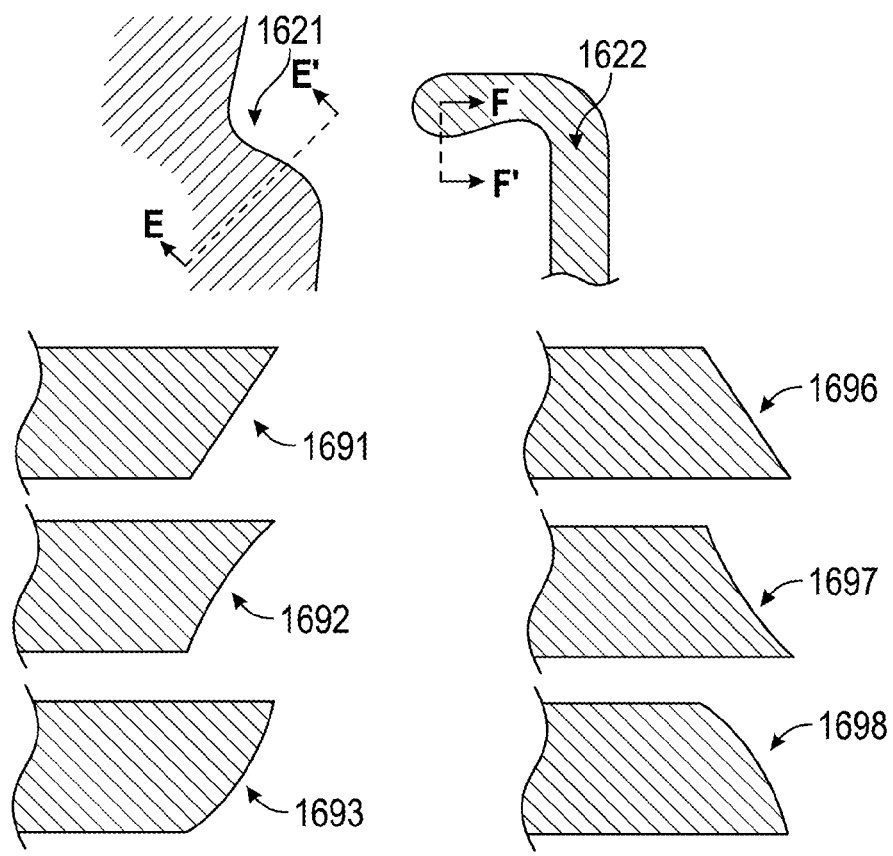

1710 —↘
In response to a press input to a pressable touchsurface, providing first reaction forces through physical interactions between different sections of a spring guiding profile and a contact portion that cause different deflections of the deflectable spring. The first reaction forces resist pressable touchsurface motion from an unpressed position to a pressed position.

1720 —↘
In response to a removal of the press input, providing second reaction forces through second physical interactions between the spring guiding profile and the contact portion. The second reaction forces bias the pressable touchsurface toward the unpressed position.

FIG. 17

KEYCAP ASSEMBLY WITH AN INTERACTIVE SPRING MECHANISM

RELATED APPLICATION(S)

This application claims the benefit of U.S. Provisional Application No. 61/680,261 filed Aug. 6, 2012.

FIELD OF THE INVENTION

This invention generally relates to electronic devices.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e. "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

BRIEF SUMMARY OF THE INVENTION

Methods and apparatus for a touchsurface assembly such as a key assembly is described. The touchsurface assembly comprises a base, a pressable touchsurface such as the surface of a keycap, and a deflectable spring. The pressable touchsurface is configured to move between an unpressed position and a pressed position relative to the base. The unpressed and pressed positions are separated in a press direction and in a first lateral direction orthogonal to the press direction. The deflectable spring comprises a fixed portion and a contact portion. The contact portion is configured to contact a spring guiding profile. The fixed portion and the spring guiding profile are fixed to different touchsurface assembly elements selected from group consisting of the base and the keycap. As the pressable touchsurface moves from the unpressed position to the pressed position, the contact portion physically interacts with different sections of the spring guiding profile. This interaction causes different deflections of the deflectable spring and produces reaction forces that resist keycap motion toward the pressed position and bias the keycap toward the unpressed position.

BRIEF DESCRIPTION OF DRAWINGS

Example embodiments of the present invention will hereinafter be described in conjunction with the appended drawings which are not to scale unless otherwise noted, where like designations denote like elements, and:

FIGS. 5A-D show simplified side and cross-sectional views of an example touchsurface assembly;

FIGS. 10A-B show bottom views of two example deflectable spring and spring guiding profile designs;

FIGS. 11A-B show exemplary tactile response curves;

FIG. 16 show six example cross sections that may be found in different embodiments of the spring guiding profile or the deflectable spring; and FIG. 17 shows a method 1700 that can be used for affecting motion of a pressable touchsurface of an example touchsurface assembly.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprises other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
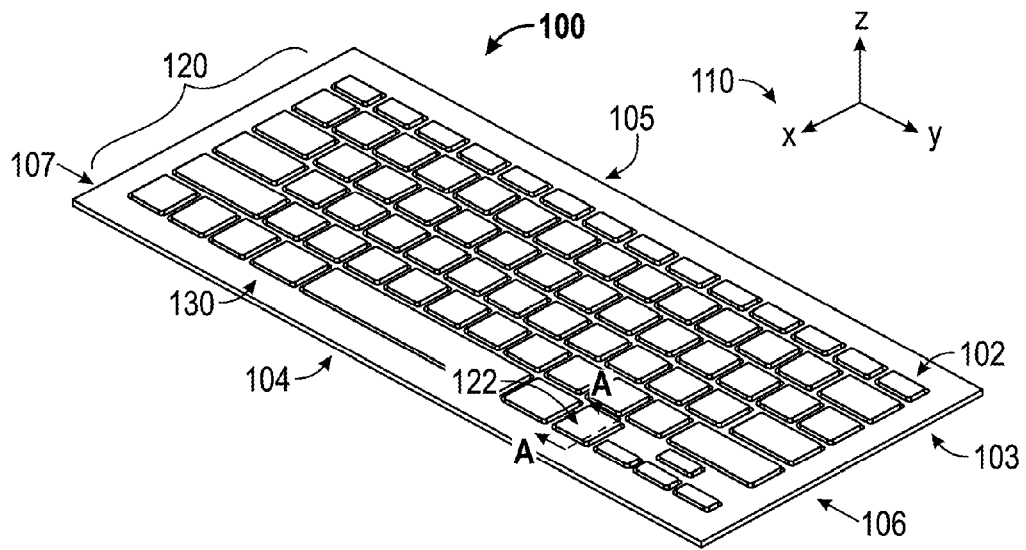
FIG. 1 shows an example keyboard that incorporates one or more implementations of key-based touchsurfaces configured in accordance with the techniques described herein.

FIG. 1 shows an exemplary keyboard 100 that incorporates a plurality of (two or more) pressable key-based touchsurfaces configured in accordance with the techniques described herein. The exemplary keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the exemplary keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a touchsurface, modulates that sensor electrodes with respect to a reference voltage (e.g., system ground), and detects the capacitive coupling between that sensor electrode and the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a component having the touchsurface, one transmitter and one receiver. The resulting signal received by the receiver is affected by the transmitter signal and the location of the component having the touchsurface.

In some embodiments, the sensor system used to detect touchsurface presses may also detect pre-presses. For example, a capacitive sensor system may also be able to detect a user lightly touching a touchsurface, and distinguish that from the press of the touchsurface. Such a system can support multi-stage touchsurface input, which can respond differently to light touch and press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s).

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be integrated into a laptop computer comprising one or more processing systems formed from one or more ICs (integrated circuits) having appropriate processor-executable instructions for responding to key presses. These instructions direct the appropriate IC(s) to operate keyboard sensors to determine if a key has been pressed (or the extent of the press), and provide an indication of press status to a main CPU of the laptop or a response to the press status to a user of the laptop.

While the orientation terminology, vertical-lateral travel, sensing technology, and implementation options discussed here focuses on the keyboard 100, these discussions are readily analogized to other touchsurfaces and devices described herein.

Figure 2:
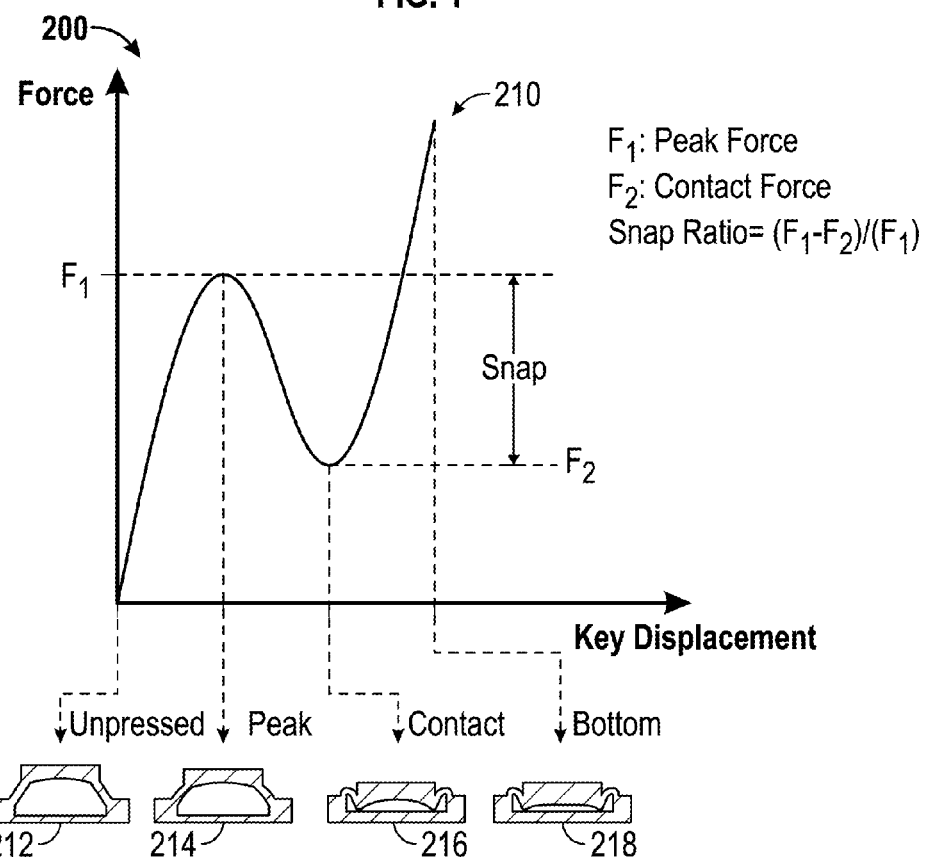
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard key embodiments utilize snap ratios no less than 0.4 and no more than 0.6. Other tactile keyboard key embodiments may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
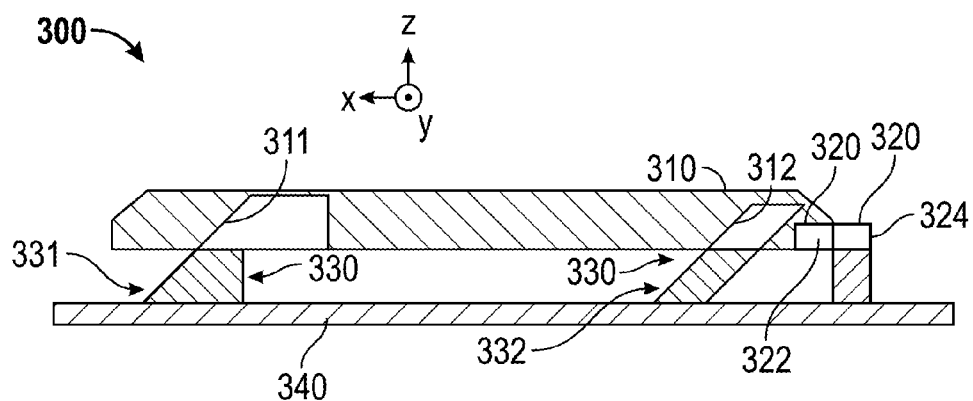
FIGS. 3A-3B are simplified side views of a first example touchsurface assembly configured in accordance with the techniques described herein.
Figure 3B:
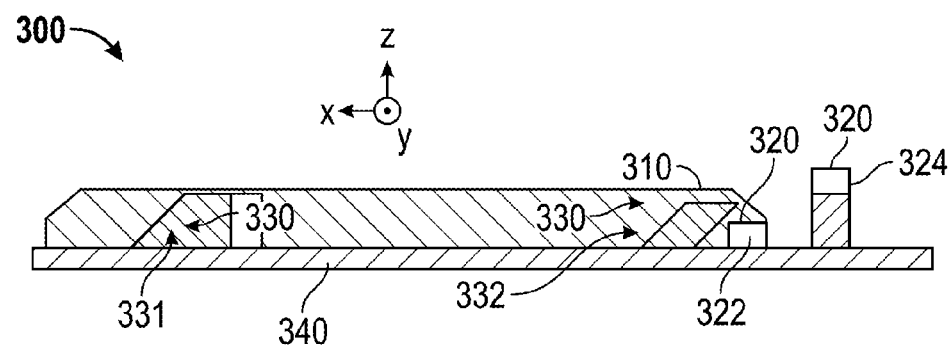

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these figures illustrate A-A' sectional views of the key 122. FIG. 3A shows the exemplary key assembly 300 in an unpressed position and FIG. 3B shows the same key assembly 300 in a pressed position. The key assembly 300 may also be used in other devices utilizing keys, including keyboards other than the keyboard 100 and any other appropriate key-using device.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the exemplary embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross-sections. For example, magnetically coupled component 322 or 324 may comprise a magnetic, box-shaped subcomponent disposed against a central portion of a ferrous, U-shaped subcomponent.

In some implementations, the magnetically coupled component 322 is physically attached to a bezel or base proximate to the keycap 310. The magnetically coupled component 324 is physically attached to the keycap and magnetically interacts with the magnetically coupled component 322. The physical attachment of the magnetically coupled components 322, 324 may be direct or indirect (indirectly via one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 is urged to move in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIG. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piece-wise linear, or nonlinear sections, those having simple or complex curves or surfaces, or those including various convex and concave features. Similarly, the ramp contacting features on the keycap 310 may be simple or complex, and may comprise linear, piecewise linear, or non-linear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
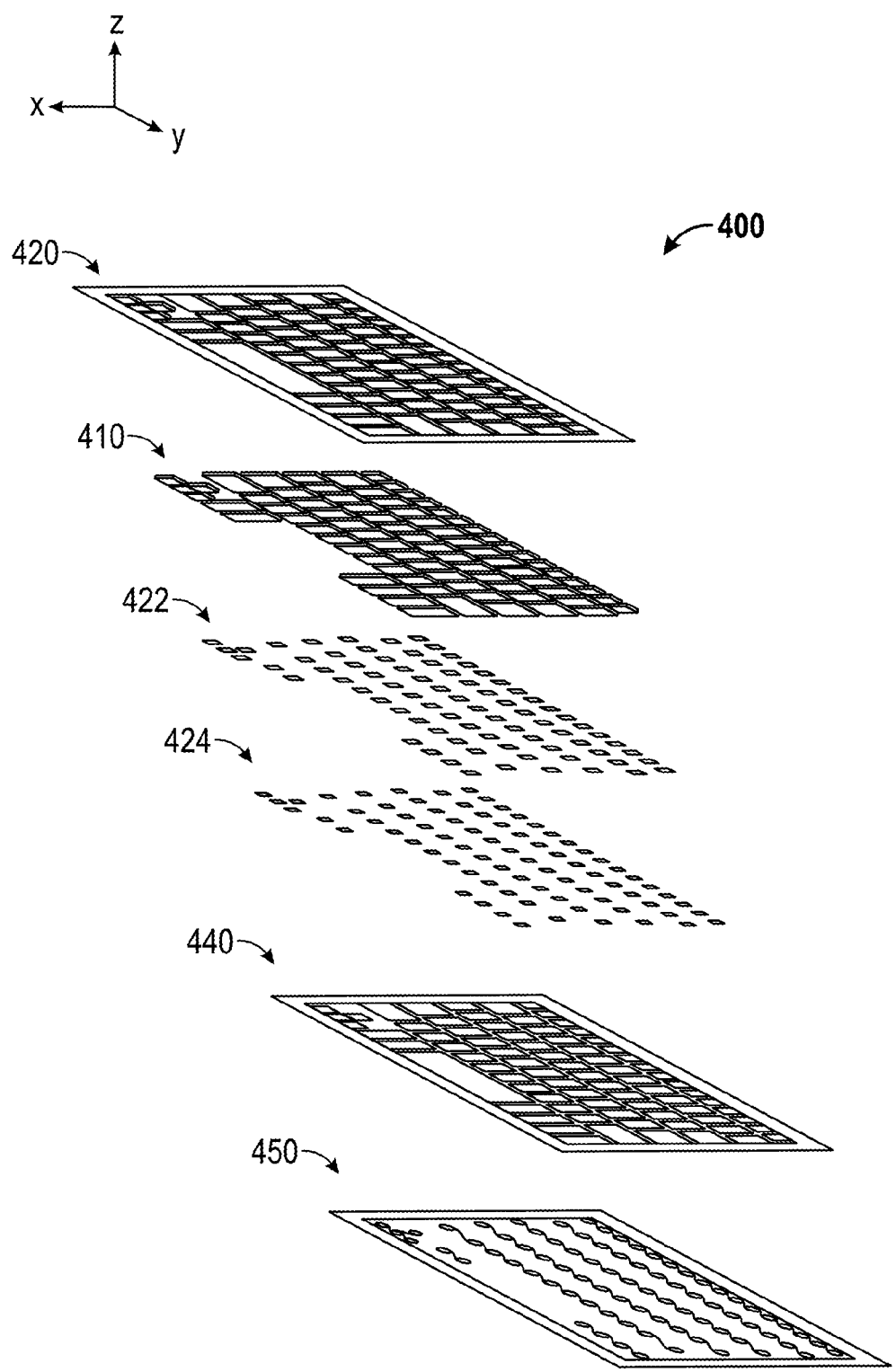
FIG. 4 shows an exploded view of an example keyboard in accordance with the techniques described herein

FIG. 4 shows an exploded view of an exemplary keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

FIGS. 5A-D show simplified side and cross-sectional views of a second example touchsurface assembly. Specifically, FIGS. 5A-D show a key assembly 500 that may be used to enable the key 122 of the keyboard 100. The key assembly 500 may also be used in other devices utilizing keys, including keyboards other than the keyboard 100 and any other appropriate key-using device. Further, assemblies analogous to the key assembly 500 may be used to enable non-key touchsurface assemblies with pressable touchsurfaces, such as buttons, opaque touchpads, touchscreens, or any of the touchsystems described herein.

The coordinate system indicated in FIGS. 5A-D is analogous to the coordinate system shown for FIGS. 3A-B. A finger 515 is also shown in FIGS. 5A, 5C to help convey orientation and unpressed/pressed states of the key assembly 500. FIGS. 5A-B show side and B-B' cross-sectional views, respectively, of the key assembly 500 in an unpressed position, and FIGS. 5C-D show side and C-C' cross-sectional views, respectively, of the key assembly 500 in a pressed position.

The key assembly 500 comprises a keycap 510 that is visible to users and configured to be pressed by users, a ready/return mechanism 520, a planar translation effecting (PTE) mechanism 530, and a base 540. The keycap 510, PTE mechanism 530, and base 540 are similar to the keycap 310, PTE mechanism 330, and base 340. The descriptions of these three key assembly 300 components are readily analogized to these similar structures of the key assembly 500. For example, the keycap 510 is configured to move between an unpressed position and a pressed position.

The unpressed and pressed positions of the keycap 510 can be characterized by the vertical spacing, h, between a bottom of the keycap 510 and a top of the base 540 and a lateral spacing, d, between an edge of the keycap 510 and an arbitrary reference fixed relative to the base 540. The unpressed position is associated with the distances $h_u$ and $d_u$, and the pressed position is associated with the distances $h_p$ and $d_p$. Thus, the unpressed and pressed positions of the touchsurface of the keycap 510 are separated in a press direction (negative-Z direction) by a first amount ($h_u$-$h_p$) and in a lateral direction (positive-X direction) by a second amount ($d_u$-$d_p$). The lateral direction is orthogonal to the press direction. These first and second amounts may have any ratio allowed by the physical constraints of the assembly. One may be many times the other, for example. In some embodiments, the first amount in the press direction is at least as much as the second amount in the lateral direction, and the first amount is no larger than twice the second amount.

The ready/return mechanism 520 may also be termed a biasing mechanism since it is configured to bias the keycap 510 away from the base 540. The ready/return mechanism 520 comprises a first deflectable spring 522 and a first spring guiding profile 521 on a first side of the keycap 510. The first deflectable spring 522 comprises a first fixed portion 527, and a first contact portion 525 configured to contact the first spring guiding profile 521. The ready/return mechanism 520 further comprises a second deflectable spring 524 and a second spring guiding profile 523 on a second, opposite side of the keycap 510. The second deflectable spring 524 comprises a second fixed portion 528, and a second contact portion 526 configured to contact the second spring guiding profile 523.

The first fixed portion 527 and the first spring guiding profile 521 are fixed to different parts of the key assembly 500. In the example shown in FIG. 5, the first fixed portion 527 is fixed to the base 540 by being attached directly, or indirectly through one or more intermediate components, to the base 540. Meanwhile, the first spring guiding profile 521 is fixed to the keycap 510 by being formed into a surface of the keycap 510. In some embodiments, either or both the first deflectable spring 522 and the first spring guiding profile 521 move in part or in whole relative to an inertial frame of reference in response to a press of the keycap 510, such that the two components move relative to each other.

Similarly, the second fixed portion 528 of the second deflectable spring 523 and the second spring guiding profile 522 are fixed to different parts of the key assembly 500. (However, the first and second fixed portions 527, 528 may be fixed to the same part or to different parts of the key assembly 500; similarly, the first and second spring guiding profiles 521, 522 may be fixed to the same part or to different parts of the key assembly 500.) In some embodiments, either or both the second deflectable spring 523 and the second spring guiding profile 522 move in part or in whole relative to an inertial frame of reference in response to a press of the keycap 510, such that the two components move relative to each other.

As shown by FIGS. 5A-D, as the keycap 510 moves from the unpressed position to the pressed position, the contact portions 525, 526 physically interact with different sections of the first and second spring guiding profiles 521, 523, respectively. That is, the first and second contact portions 525, 526 physically contact, apply forces to, and receive forces from, different sections of the first and second spring guiding profiles 521, 523, respectively. These interactions cause different deflections of the first and second deflectable springs 522, 524, and produces reaction forces that resist the motion of the keycap 510 toward the pressed position and bias the keycap 510 toward the unpressed position. Thus, the ready/return mechanism 520 resists keycap movement toward the pressed position in response to press force applied to the keycap 510.

These reaction forces may directly impede keycap 510 travel. For example, in some embodiments, some or all of the reaction forces directly impede vertical or lateral keycap 510 travel to the pressed position. The reaction forces may also indirectly impede keycap 510 travel. For example, in some embodiments, the reaction forces include normal forces generated by the contact between deflectable springs 522, 524 and their corresponding spring guiding profiles 521, 523; these normal forces indirectly impede keycap 510 travel by causing friction-type reaction forces that directly impede keycap 510 travel.

In some embodiments, in response to a removal of the press force, the ready/return mechanism 520 applies forces that bias the keycap 510 toward the unpressed position.

The tactile forces applied to the user results at least in part from the impediment to the keycap 510 travel provide by the interactions of the deflectable springs 522, 524 and corresponding spring guiding profiles 521, 523. For example, in some embodiments with a ramp-based PTE mechanism 530, the interactions of the deflectable springs 522, 524 and corresponding spring guiding profiles 521, 523 impede the lateral motion of the keycap 510. In some embodiments, this stops the keycap from moving down the ramps of the ramp-based PTE mechanism 530 in response to a finger applying a press force less than a threshold amount, which then defines the tactile forces applied to the user's finger.

In some embodiments, the key assembly 500 also comprises a sensor for detecting the pressed state of the keycap 510. The sensor may use any appropriate technology, including any of the ones described herein. FIGS. 5A, 5C illustrate transcapacitive capacitive sensor electrodes 562, 564 disposed spaced from the keycap 510. These capacitive sensor electrodes are used to detect changes in capacitance caused by changes in the position of the keycap 510 relative to the capacitive sensor electrodes 562, 564. In some embodiments, the keycap 510 comprises primarily dielectric material, and the change in the position of the dielectric material of the keycap 510 causes the primary changes in capacitance. In some embodiments, conductive material is disposed in or on the keycap 510, and the change in position of the conductive material of the keycap 510 causes the primary changes in capacitance. In some embodiments, the sensor electrodes 562, 564 are configured to actively detect unpressed and pressed positions of the keycap 510. In some embodiments, the sensor electrodes 562, 564 are configured to actively detect only the pressed state of the keycap 510, and it is assumed that no detection of the pressed state means the keycap 510 is unpressed, or vice versa. A processing system (not shown) communicatively coupled to the sensor electrodes 562, 564 drives the sensor electrodes 562, 564 to produce signals indicative of the capacitive coupling, and determines a press state of the keycap 510 based on these signals.

Many variations of the key assembly 500 are contemplated. For example, different deflectable spring and spring guiding profile configurations have different responses to press force. Different geometry of the deflectable springs, spring guiding profiles, and how they are fixed in the key assemblies, change how they interact with each other and how the deflectable springs deflect. As a specific example, some embodiments comprise shorter deflectable springs, which generally are stiffer and less compliant. Meanwhile, other embodiments comprise longer deflectable springs, which are generally less stiff and more compliant. Also, various embodiments have different configurations that apply more bending or stretching forces to the deflectable springs. The mechanical response of a particular design can be determined through analysis and modeling using a variety of well-developed theories or tools.

As a set of examples of variations of the key assembly 500, in some embodiments, the first or the second fixed portion 527, 528 is attached directly or indirectly to the base 540, and keeps stationary relative to the base 540 during typical keypress operation. In more detail, FIGS. 6, 7A-L show some example key assemblies with different deflectable spring and spring guiding profile designs, where all of the deflectable springs are attached directly, or indirectly through one or more intermediate components, to the base.

Figure 6:
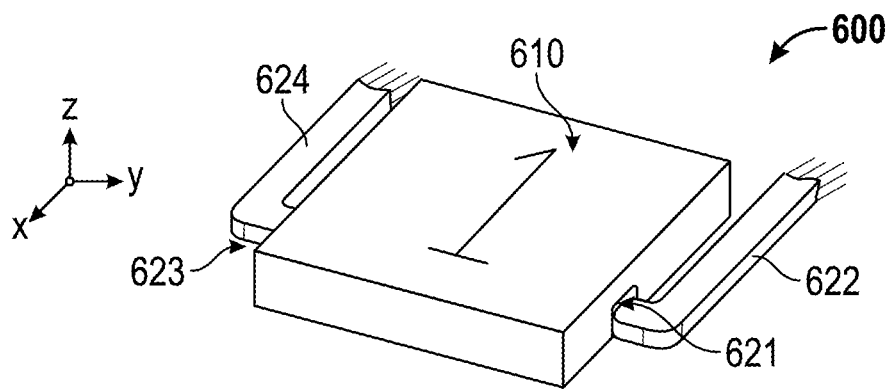
FIG. 6 shows a perspective view of an example key assembly.

FIG. 6 shows a perspective view of a key assembly 600 with a keycap 610 having two spring guiding profiles 621, 623 that contact two deflectable springs 622, 624, respectively. The number "1" has been illustrated on the top of the keycap 610 to indicate orientation. FIGS. 7A-L show bottom and front or cross sectional views of example key assemblies 600, 700C, 700E, 700G, 700J, and 700K. The number "1" has been illustrated with a dotted outline to indicate orientation. Many key assembly components and features (such as bases) are not shown in FIGS. 6, 7A-L for clarity of understanding. The approaches shown in FIGS. 6, 7A-K can also be applied to non-key touchsurface assemblies.

Figure 7A:
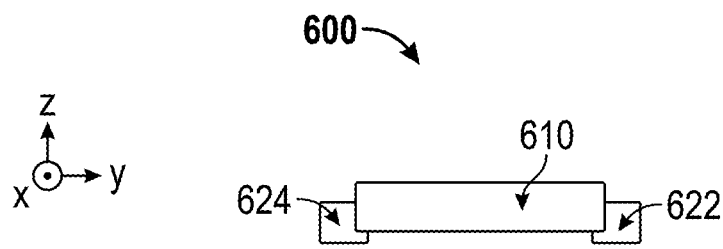
FIGS. 7A-L show views of example key assemblies.
Figure 7B:
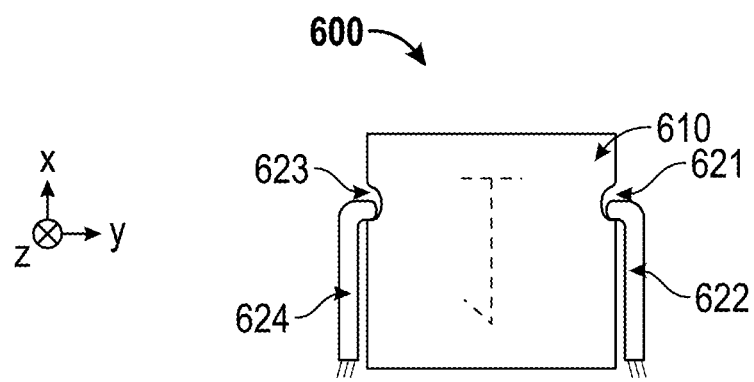

FIGS. 7A-B show front and bottom views, respectively, of the key assembly 600.

Figure 7C:
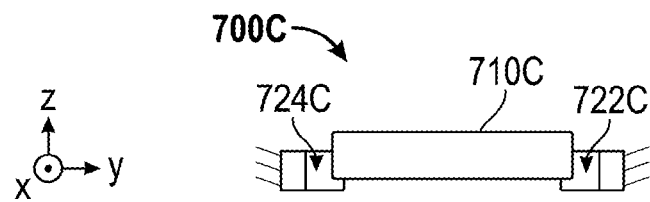
Figure 7D:
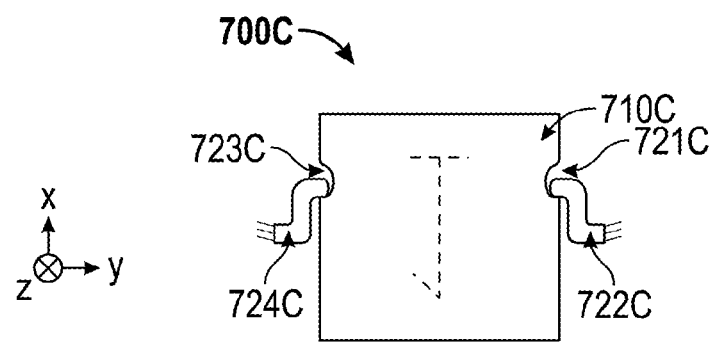

FIGS. 7C-D show front and bottom views, respectively, of an example key assembly 700C. The key assembly 700C comprises a keycap 710C having spring guiding profiles 721C, 723C that interact with deflectable springs 722C, 724C, respectively. As shown in FIG. 7D, the deflectable springs 722C, 724C extend only part of the length (in the X direction as shown) of the keycap 710C.

Figure 7E:
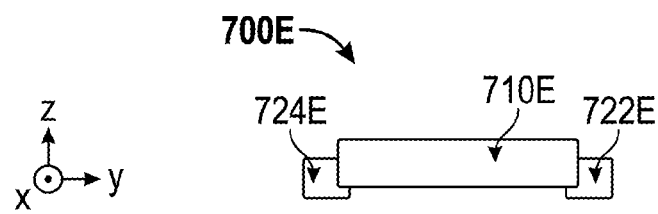
Figure 7F:
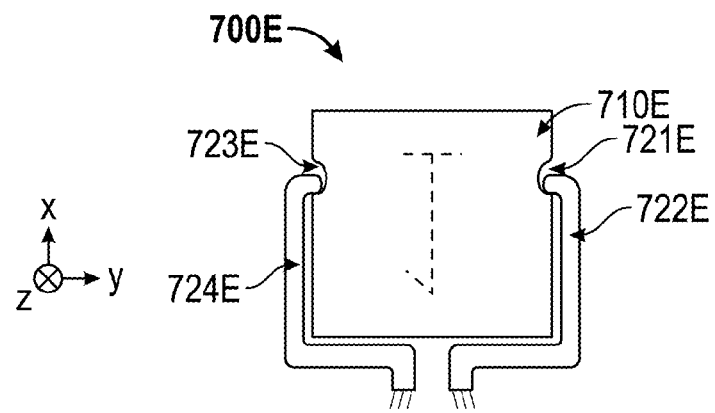

FIGS. 7E-F show front and bottom views, respectively, of an example key assembly 700E. The key assembly 700E comprises a keycap 710E having spring guiding profiles 721E, 723E that interact with deflectable springs 722E, 724E, respectively. The deflectable springs 722E, 724E extend around the keycap 710E to attach to the base (not shown) near a back edge of the keycap 710E.

Figure 7G:
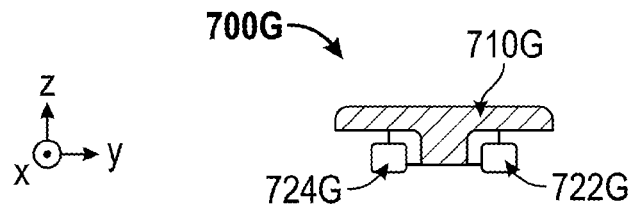
Figure 7H:
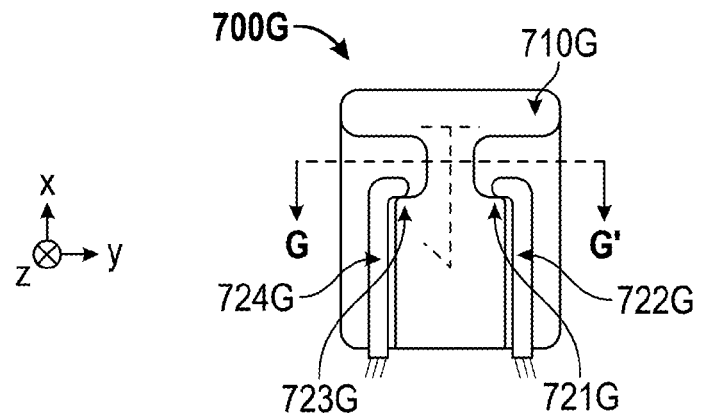

FIGS. 7G-H show G-G' cross-sectional and bottom views, respectively, of an example key assembly 700G. The key assembly 700G comprises a keycap 710G having spring guiding profiles 721G, 723G that interact with deflectable springs 722G, 724G, respectively. The deflectable springs 722G, 724G are located under the keycap 710G, such that the footprint of the key assembly 700G is not wider than the keycap 710G.

Figure 7I:
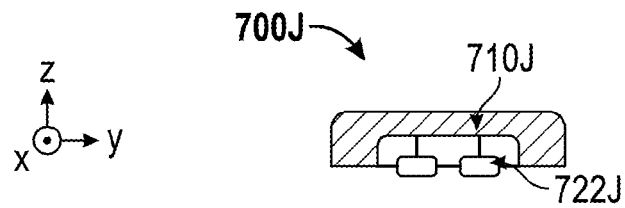
Figure 7J:
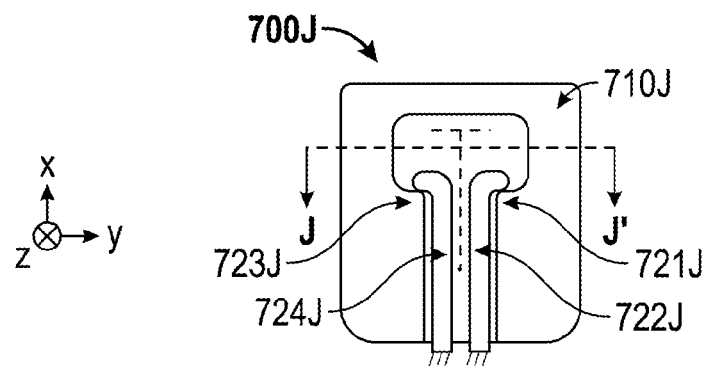

FIGS. 7I-J show J-J' cross-sectional and bottom views, respectively, of an example key assembly 700J. The key assembly 700J comprises a keycap 710J having spring guiding profiles 721J, 723J that interact with deflectable springs 722J, 724J, respectively. The deflectable springs 722J, 724J are located under the keycap 710J, such that the footprint of the key assembly 700J is not wider than the keycap 710J. Further, the deflectable springs 722J, 724J are oriented such they deflect inwards during normal operation, toward a middle of the keycap 710J.

Figure 7K:
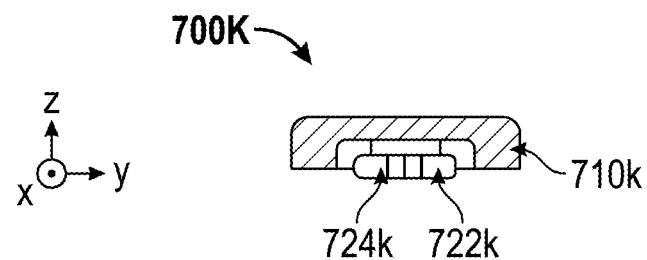
Figure 7L:
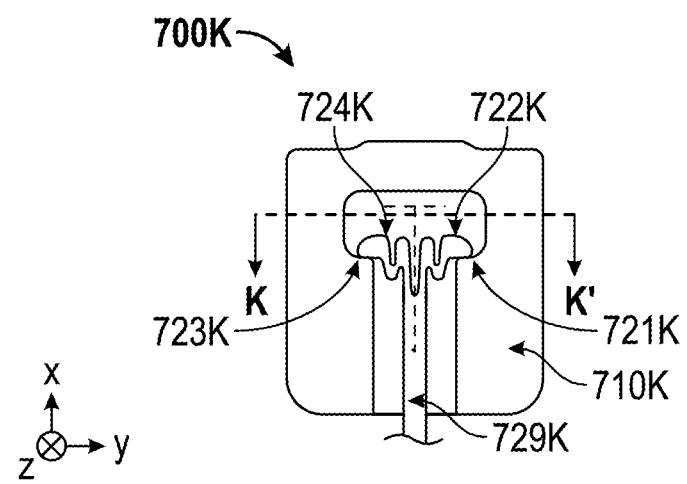

FIGS. 7K-L show K-K' cross-sectional and bottom views, respectively, of an example key assembly 700K. The key assembly 700K comprises a keycap 710K having spring guiding profiles 721K, 723K that interact with deflectable springs 722K, 724K, respectively. The deflectable springs 722K, 724K are located under the keycap 710K, such that the footprint of the key assembly 700K is not wider than the keycap 710K. The deflectable springs 722K, 724K comprise serpentine shapes that increase the compliance of the deflectable springs 722K, 724K. The deflectable springs 722K, 724K are also oriented such they deflect inwards during proper operation, toward a middle of the keycap 710K. Further, the deflectable springs 722K, 724K extend off of a main trunk 729K that is directly or indirectly attached to the base (the base is not illustrated).

As another set of examples of variations of the key assembly 500, in some embodiments, the first or the second fixed portion 527, 528 is attached directly or indirectly to the keycap 510, and keeps stationary relative to the keycap 510 during typical keypress operation. In more detail, FIGS. 8, 9A-I show some example key assemblies with different deflectable spring and spring guiding profile designs, where all of the deflectable springs are attached directly, or indirectly through one or more intermediate components, to the keycap.

Figure 8:
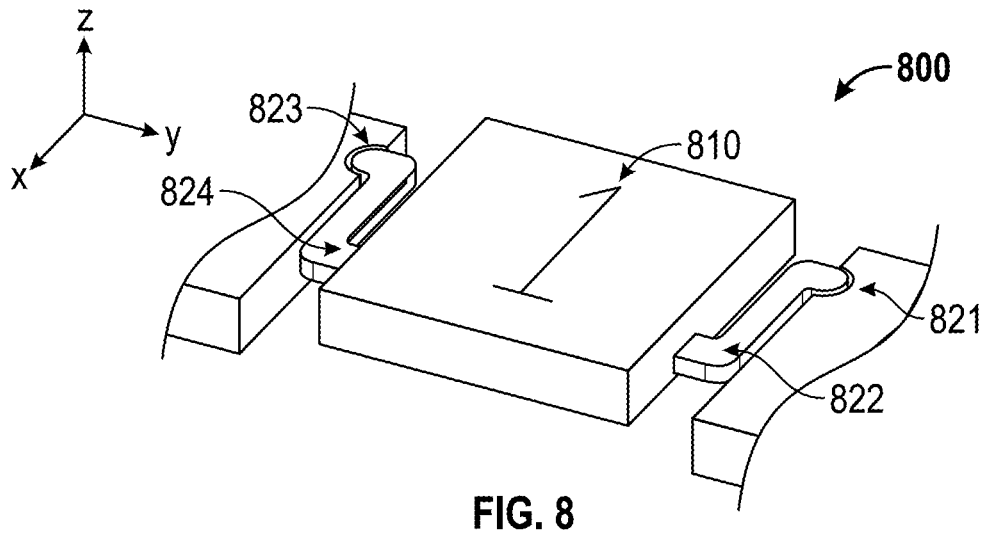
FIG. 8 shows a perspective view of an example key assembly.

FIG. 8 shows a perspective view of a key assembly 800 with a keycap 810 having two spring guiding profiles 821, 823 that contact two deflectable springs 822, 824, respectively. FIGS. 9A-J show bottom and front views of example key assemblies 800, 900C, 900E, 900G, 900J. The number "1" has been illustrated with a dotted outline to indicate orientation. Many key assembly components and features are not shown in FIGS. 8, 9A-I for clarity of understanding. The approaches shown in FIGS. 8, 9A-I can also be applied to non-key touchsurface assemblies.

Figure 9A:
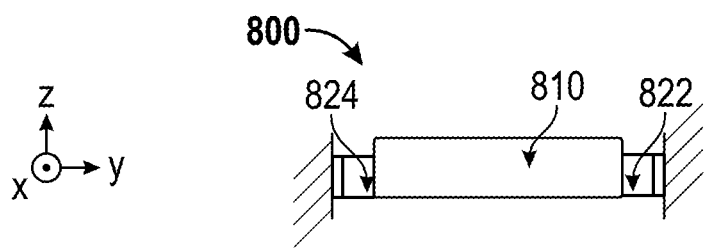
FIGS. 9A-J show views of example key assemblies.
Figure 9B:
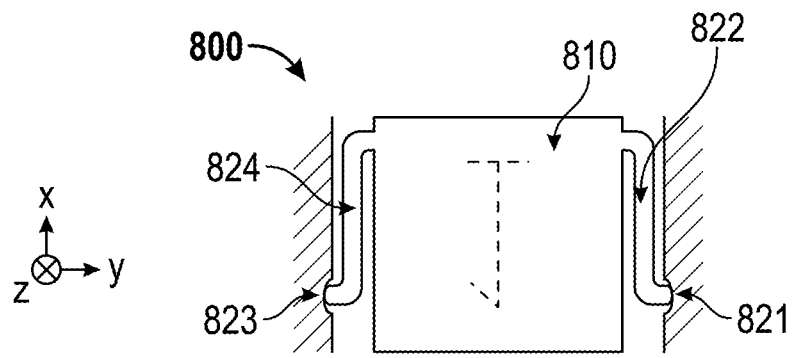

FIGS. 9A-B show front and bottom views, respectively, of the key assembly 800.

Figure 9C:
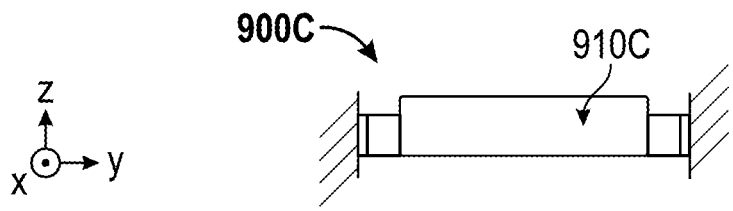
Figure 9D:
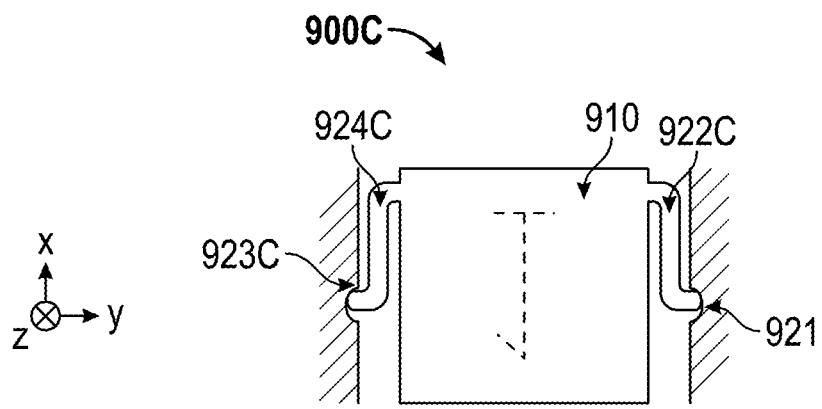

FIGS. 9C-D show front and bottom views, respectively, of an example key assembly 900C. The key assembly 900C comprises a keycap 910C having deflectable springs 922C, 924C that interact with spring guiding profiles 921C, 923C on the base, respectively. As shown in FIG. 9D, the deflectable springs 922C, 924C extend only part of the length (in the X direction) of the keycap 910C.

Figure 9E:
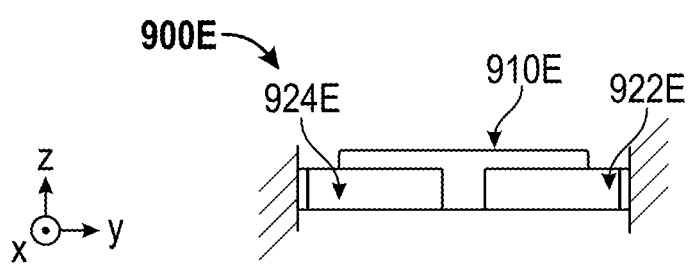
Figure 9F:
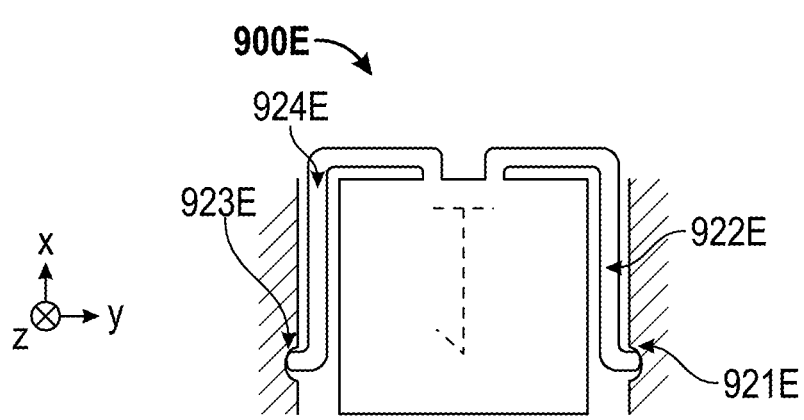

FIGS. 9E-F show front and bottom views, respectively, of an example key assembly 900E. The key assembly 900E comprises a keycap 910E having deflectable springs 922E, 924E that interact with spring guiding profiles 921E, 923E on the base, respectively. The deflectable springs 922E, 924E extend around the keycap 910E to attach to the keycap 910C near a front edge of the keycap 910E.

Figure 9G:
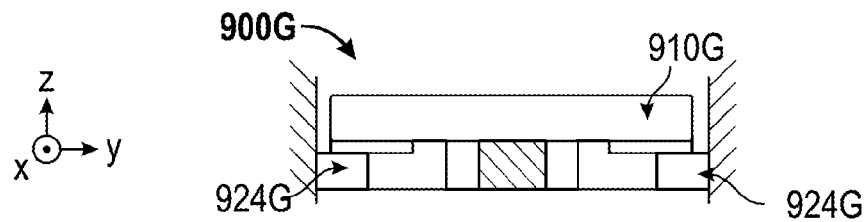
Figure 9H:
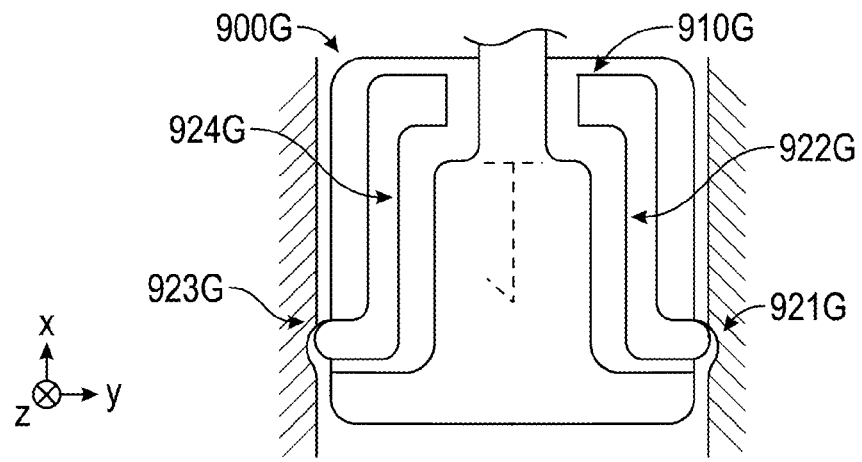

FIGS. 9G-9H show front and bottom views, respectively, of an example key assembly 900G. The key assembly 900G comprises a keycap 910G having deflectable springs 922G, 924G that interact with spring guiding profiles 921G, 923G on the base, respectively. The deflectable springs 922G, 924G are inset under the keycap 910G, such that the footprint of the key assembly 900G is only slightly larger than the footprint of the keycap 910G.

Figure 9I:
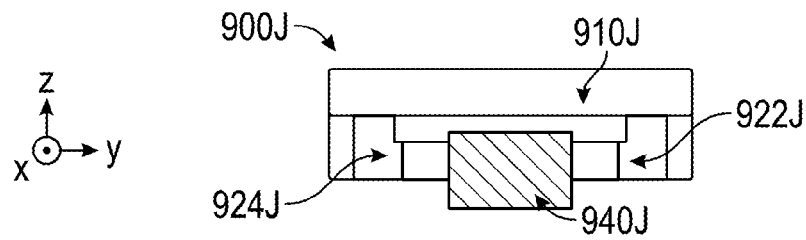
Figure 9J:
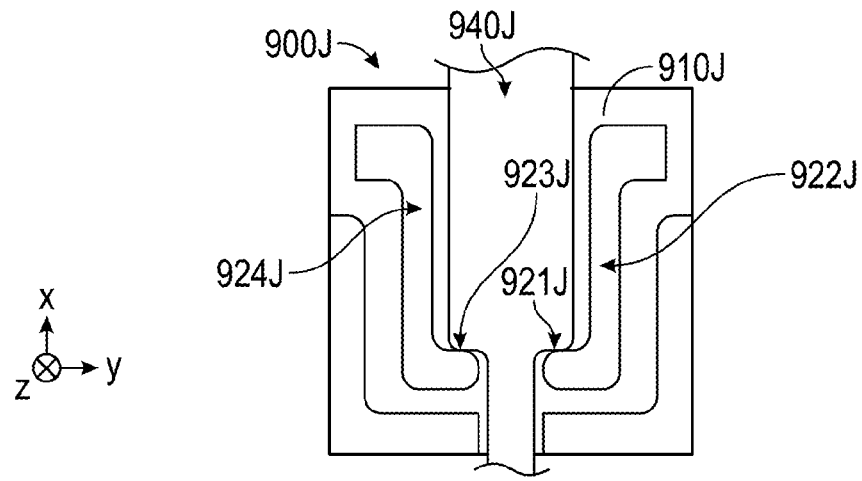

FIGS. 9I-9J show front and bottom views, respectively, of an example key assembly 900J. The key assembly 900J comprises a keycap 910J having deflectable springs 922J, 924J that interact with spring guiding profiles 921J, 923J on the base, respectively. The deflectable springs 922J, 924J are located under the keycap 910J completely, such that the footprint of the key assembly 900J is not wider than the keycap 910J. Further, the spring guiding profiles 921J, 923J are located under the keycap 910J, in a central region of the base 940J. The deflectable springs 922J, 924J are oriented inwards to interact with these spring guiding profiles 921J, 923J, and deflect away from the middle of the keycap during normal operation.

Referring again to FIGS. 5A-D, the additional examples of variations of the key assembly 500 below, like the variations described above, can also be applied to non-key-based touchsurface assemblies.

In some embodiments, the ready/return mechanism 520 is partially or fully integrated with the PTE mechanism 530. For example, in some embodiments of the key assembly 500, the deflectable springs 522, 524 and the spring guiding profiles 521, 523 provide or augment the planar translation effecting function. As a specific example, in some embodiments, one or more of the spring guiding profiles 521, 523 include one or more ramps. These ramps interact with the parts of the associated deflectable spring 522, 524 (such as the contact portions 525, 526) to form part or all of the PTE mechanism 530. As another specific example, in some embodiments, ramps separate from the spring guiding profiles 521, 523 interact with the deflectable spring 522, 524 to provide part or all of the PTE mechanism 530.

As an additional example of variations possible for the key assembly 500, the deflectable springs and spring guiding profiles may be formed from any appropriate material or combination of materials. Example materials for deflectable springs include plastics such as ABS (acrylonitrile butadiene styrene), elastomers such as rubber, and metals such as copper, copper alloys such as beryllium copper, steel, etc. These materials may provide linear or non-linear deflections and reaction forces in response to a press of the keycap 510.

As another example of variations, some embodiments of the key assembly 500 comprise fewer or more deflectable springs than shown. Some embodiments comprise three, four, five, six, or any other appropriate number of deflectable springs. Some embodiments comprise a single deflectable spring located at a central region of the keycap 510 or base 540, or a single deflectable spring located at an edge region of the keycap 510 or base 540. These single deflectable springs may be balanced by one or more appropriate guides or reaction force providers located at appropriate locations. For example, a deflectable spring at an edge region may be balanced by a guide located at an opposite edge region.

As yet another example of variations, a deflectable spring may have multiple contact portions configured to contact the same spring guiding profile or different spring guiding profiles. Thus, some embodiments comprise a deflectable spring with multiple contact portions configured to contact different sections of the same spring guiding profile, or different spring guiding profiles.

As a further example of variations, some embodiments comprise one or more spring guiding profiles fixedly attached to the base, and one or more corresponding deflectable springs fixedly attached to the keycap. In contrast, some embodiments comprise one or more spring guiding profiles fixedly attached to the keycap, and one or more corresponding deflectable springs fixedly attached to the base.

As yet another example of variations, a deflectable spring may be formed integrally with or separately from the key assembly element to which the fixed portion of the deflectable spring is affixed. For example, in some embodiments, the deflectable spring is formed as a same piece of material and is a portion of the same piece part as the keycap, the base, or another key assembly component such a component fixed relative to the keycap or base. In contrast, in some embodiments, the deflectable spring is formed as a separate piece part that is attached to the keycap, the base, or as another key assembly component such as one fixed relative to the keycap or base.

FIGS. 10A-B show bottom views of two example deflectable spring and spring guiding profile design 1000A, 1000B that may be used as part or all of a ready/return mechanism, such as the ready/return mechanism 520 of the key assembly 500 or some other touchsurface assembly. The deflectable springs 1022A, 10622B are configured to interact with spring guiding profiles 1021A, 1021B, respectively, to generate appropriate reaction forces and provide biasing. In some embodiments, the deflectable springs 1022A, 1022B are made of a metal, and are attached to a plastic component of the associate key assembly. As shown, the deflectable springs 1022A, 1022B have different shapes that are adapted for stamped metal parts, and the spring guiding profiles 1021A, 1021B are adapted for these deflectable springs 1022A, 1022B. In other embodiments, the deflectable springs 1022A, 1022B are made of non-metal materials, and may be formed as parts of the key assembly component(s) to which they are respectively attached.

The deflectable springs 1022A, 1022B and corresponding spring guiding profiles 1021A, 1021B also show how different designs of deflectable springs and spring guiding profiles can effect different tactile responses. In the design 1000A, in response to a press input, the spring guiding profile 1022A moves in the positive X direction and causes deflection of the deflectable spring 1022A. With this design, the reaction forces provide a tactile response curve comprising a first spatial rate of increasing resistance followed by a second, lower spatial rate of increasing resistance. "Spatial rate" is used herein to indicate relative to a physical distance (or other measure of space).

FIG. 11A shows an example tactile response curve 1100A that may be associated with a design such as the design 1000A. The tactile response curve 1100A relates a magnitude of the reaction force to the amount of touchsurface movement relative to the unpressed touchsurface position. The reaction forces provide a tactile response comprising a first spatial rate of increasing resistance followed by a second spatial rate of increasing resistance, where the second spatial rate is lower than the first spatial rate.

In the design 1000B, in response to a press input, the spring guiding profile 1021B moves in the positive X direction and initially catches the contact portion of the deflectable spring 1022B. Then, as the spring guiding profile 1021B continues to move in the positive X direction, the contact portion 1025B of the deflectable spring 1022B contacts a different section of the spring guiding profile 1021B. In some embodiments, different parts of the contact portion 1025B may contact these different sections of the spring guiding profile 1021B. With a certain amount of touchsurface movement and associated movement of the spring guiding profile 1021B in the positive X direction, the deflectable spring 1022B has deformed about a locally deformable portion 1029B such that spring guiding profile 1021B no longer catches the deflectable spring 1022B, and the reaction force decreases.

FIG. 11B shows an example tactile response curve 1100B that may be associated with a design such as the design 1000B. The tactile response curve 1100B relates a magnitude of the reaction force to the amount of touchsurface movement relative to the unpressed touchsurface position. Initial reaction forces produced in response to an initial part of the keycap motion from the unpressed position to the pressed position provide an initial tactile response comprising an increasing resistance. Subsequent reaction forces produced in response to a subsequent part of the keycap motion to the pressed position provide a subsequent tactile response comprising a decreasing resistance.

Not illustrated in FIGS. 11A-B are the force responses that correspond with the removal of the press force and the return of the corresponding touchsurface to the unpressed position. The return force curves vary from design to design, and be linear or nonlinear. For example, the return force curve may describe a linear return to zero force from the end point of the press. As another example, the return force curve may describe a nonlinear return that is similar the curves shown in FIGS. 11A-B with lower force; that is, if plotted in FIGS. 11A-B they would seem similar to the curves 1100A and 1100B shifted downwards. As yet more examples, the return force curve may be piecewise linear or combine linear and nonlinear sections, and the rate of force drop may differ between different sections. As a specific example, a return force curve may have an initial section with a larger average rate of force drop, a middle section may have a smaller average rate of force drop (or even an negative rate of force drop—and thus a force increase), and a final section may have a larger average rate of force drop.

Figure 12A:
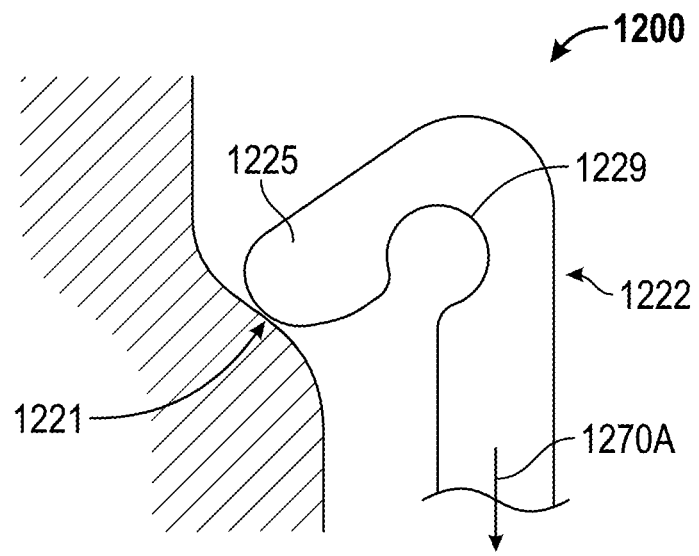
FIGS. 12A-B show an example design 1200 at three stages of spring deflection.
Figure 12B:
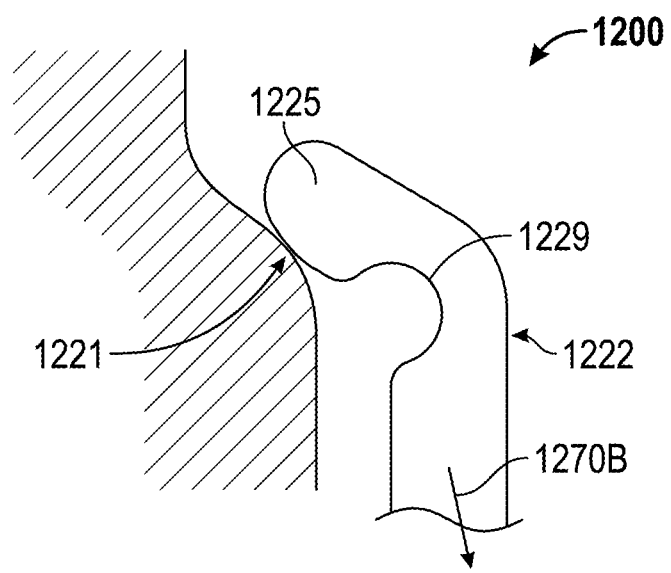

FIGS. 12A-B show a design 1200 at two stages of spring deflection. Design 1200 may be used as part or all of a ready/return mechanism, such as the ready/return mechanism 520 of the key assembly 500 or some other touchsurface assembly. FIGS. 12A-B shows part of the deflectable spring 1222 and spring guiding profile 1221. The design 1200 is similar to the design 600B of FIG. 6B in having catch and release stages, but have greater variation in cross section. In various embodiments the deflectable spring 1222 comprises metal, one or more plastics, one or more non-plastic elastomers, or a combination thereof. The design 1200 can be used in any appropriate key assemblies or touchsurface assemblies, including key assemblies 300, 500 and the other example key and touchsurface assemblies described herein.

FIG. 12A depicts an initial stage of press of the associated touchsurface. The contact portion 1225 contacts a first section of the spring guiding profile 1221. And, as the associated touchsurface is pressed, the deflectable spring 1222 catches on the spring guiding profile 1221 and a locally deformable portion 1229 of the deflectable spring 1222 begins to deform. The deflectable spring 1222 moves relative to the spring guiding profile 1221 in the direction shown by the arrow 1270A. The motion of the deflectable spring 1222 relative to the spring guiding profile 1221 may be achieved by the motion of the deflectable spring 1222 in the direction shown by the arrow 1270A, or by the spring guiding profile 1221 in the direction opposite that shown by the arrow 1270A, or a combination of these two motions. As the associated touchsurface is pressed further, the locally deformable portion 1229 further deforms and different sections of the contact portion 1225 contact different sections of the spring guiding profile 1221. This additional deformation of the deflectable spring 1222 increases the reaction forces.

Eventually, with sufficient touchsurface motion the deflectable spring 1222 achieves a release configuration and is no longer caught on the spring guiding profile 1221. FIG. 12B depicts a such a later stage of the press. The deflectable spring 1222 is in a release configuration. Further pressing causes the contact portion 1225 to slide along the spring guiding profile 1221 with reaction forces lower than an earlier part of the press. The arrow 1270B illustrates the motion of the deflectable spring 1222 relative to the spring guiding profile 1221.

The following discussion notes some similarities between the design 1000B of FIG. 10B and the design 1200 of FIG. 12. Both designs 1000B and 1200 include a deflectable spring 1022B, 1222 comprising a locally deformable portion 1029B, 1229 proximate to the contact portion 1025B, 1225. In response to an initial part of the touchsurface motion from the unpressed position to the pressed position, the locally deformable portion 1029B, 1229 deforms and puts the deflectable spring 1022B, 1222 in a release configuration. In both designs 1000B, 1200, the locally deformable portion 1029B, 1229 and the contact portion 1025B, 1225 together comprise a hook-shaped section of the deflectable spring. Other embodiments with this catch-and-release approach may comprise hook or non-hook shapes.

Figure 13:
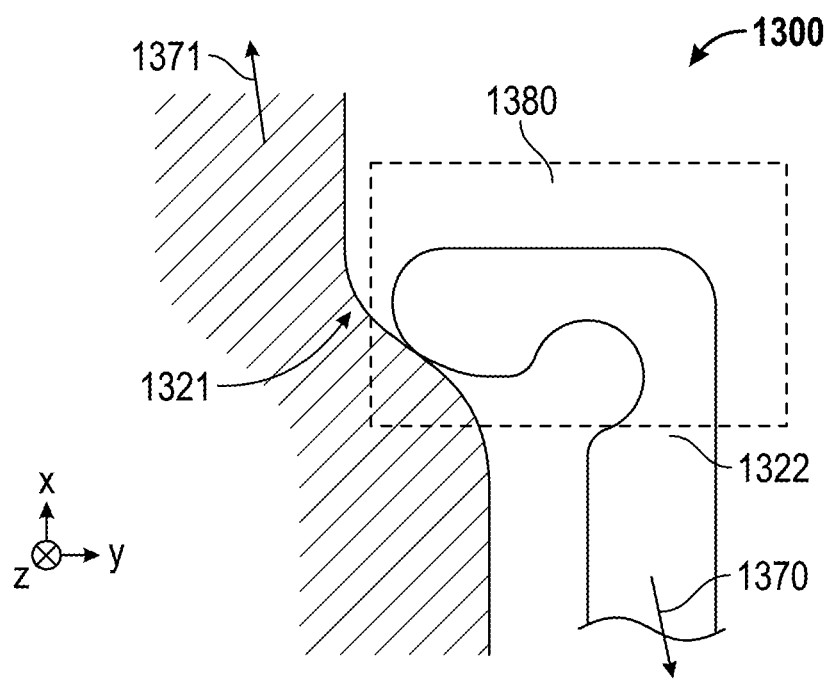
FIG. 13 show a part of an example touchsurface assembly.

FIG. 13 show a part of a design 1300 including a spring guiding profile 1321 and a deflectable spring 1322 in contact with the spring guiding profile 1321. The design 1300 may be used as part or all of a ready/return mechanism, such as the ready/return mechanism 520 of the key assembly 500 or some other touchsurface assembly. The arrow 1370 indicates the relative movement of the deflectable spring 1322 referenced to the spring guiding profile 1321, when the touchsurface assembly moves from an unpressed position to a pressed position. Similarly, the arrow 1371 indicates the movement of the spring guiding profile 1321 relative to the deflectable spring 1322, when the touchsurface assembly moves from an unpressed position to a pressed position. This relative motion may be achieved by motion of the spring guiding profile 1321, motion of the deflectable spring 1322, or both. FIG. 13 also shows a dotted rectangle 1380, which indicate the region magnified by FIGS. 14A-E and FIGS. 15A-I.

FIGS. 14A-E and FIGS. 15A-I show different example deflectable spring and spring guiding profiles that may be used in touchsurface assemblies such as the key assembly 500. FIGS. 14A-E show top views of parts of some example embodiments of deflectable springs that may comprise the deflectable spring 1322. The spring guiding profiles are not shown except as noted; this is because a variety of spring guiding profiles may be used with these different deflectable spring designs. These example deflectable springs all have reliefs, although other embodiments may not comprise such reliefs. The deflectable springs of FIGS. 14A-E are shown in the same orientation as the deflectable spring 1322 in FIG. 13.

Figure 14A:
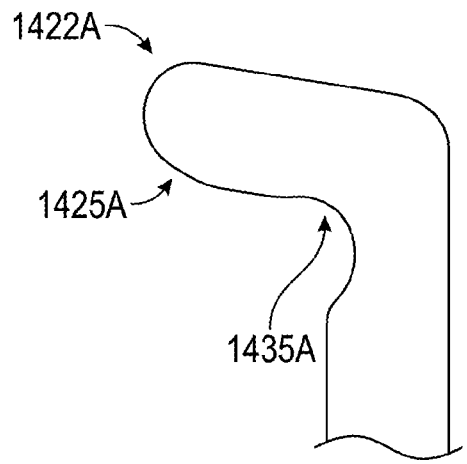
FIGS. 14A-F and FIGS. 15A-I show different example deflectable spring and spring guiding profiles that may be used with touchsurface assemblies.
Figure 14B:
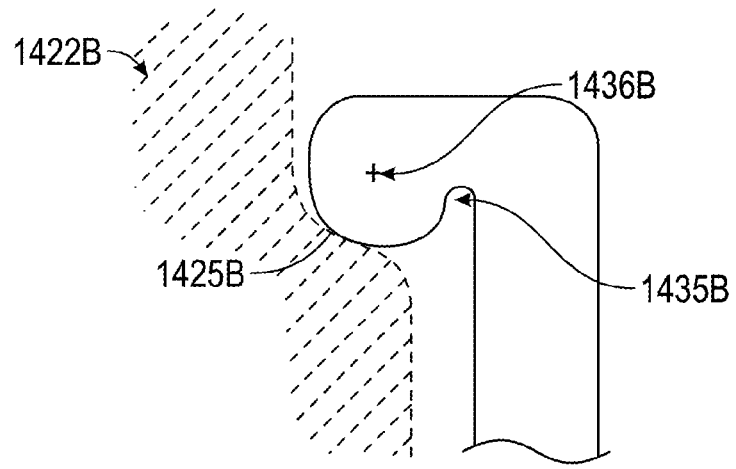
Figure 14C:
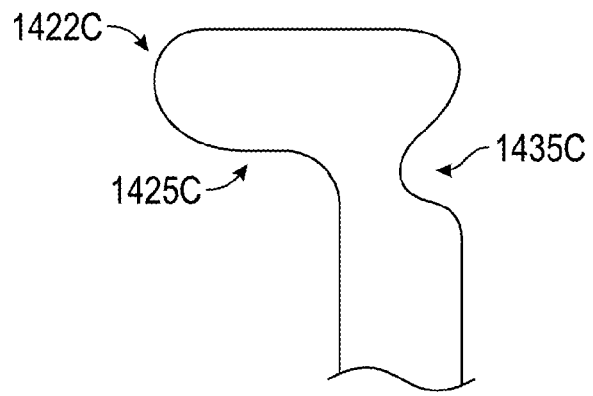
Figure 14D:
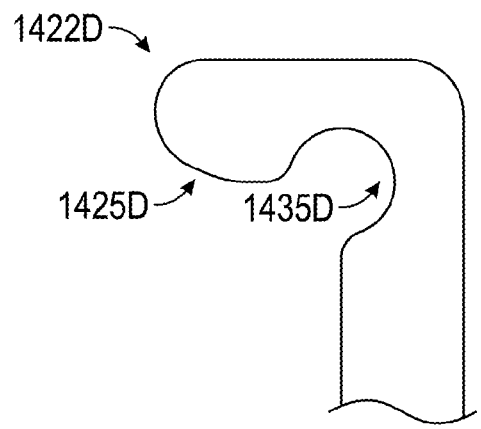

FIG. 14A shows a deflectable spring 1422A with an L-shaped portion comprising a contact portion 1425A located in the small leg of the L, and a small relief 1435A near the bend in the 'L'. FIG. 14B show a deflectable spring 1422B comprising a contact portion 1425B with a profile that spans an arc of a circle. The center 1436B of this circle is labeled with a "+." FIG. 14B also shows the spring guiding profile 1421B for context, and in this example the spring guiding profile 1421B extends beyond the center 1436B and catches more of the deflectable spring 1422B. The deflectable spring 1422B also comprises a relief 1435B. FIG. 14C shows a deflectable spring 1422C comprising a contact portion 1425C similar to the contact portion 1425A of the deflectable spring 1422A. The deflectable spring 1422C also includes a relief 1435C that is on an opposite side of the deflectable spring 1422C, when compared to the deflectable spring 1422A. FIG. 14D shows a deflectable spring 1422D comprising a contact portion 1425D. The deflectable spring 1422D is similar to the deflectable spring 1422A, except that the relief 1435D is relatively larger than the relief 1435A.

Figure 14E:
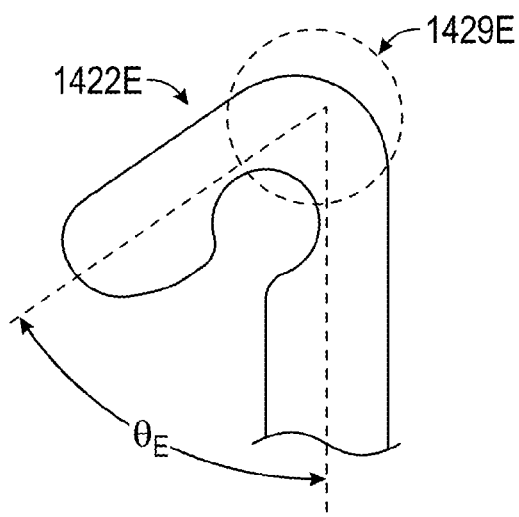
Figure 14F:
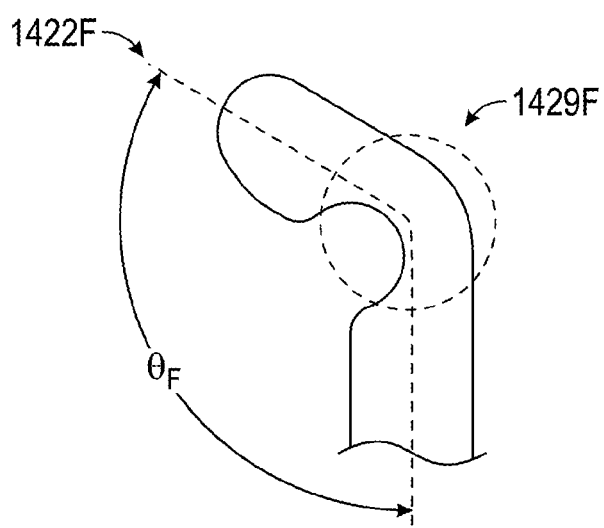

FIGS. 14E-F show deflectable springs 1422E, 1422F that are similar to each other in many ways. The deflectable springs 1422E, 1422F each comprises a contact portion (1425E and 1425F, respectively), and a relief (1435E and 1435F, respectively). The deformable sections 1429E, 1429F and the contact portions 1425E, 1425F define angles (as shown in FIGS. 14E-F, $\theta_E$ and $\theta_F$, respectively). For deflectable spring 1422E, the angle $\theta_E$ is an acute angle. For the deflectable spring 1422F, the angle $\theta_F$ is an obtuse angle. Generally, angles that are more acute provide greater resistance to touchsurface movement to the pressed position than angles that are more obtuse.

Figure 15A:
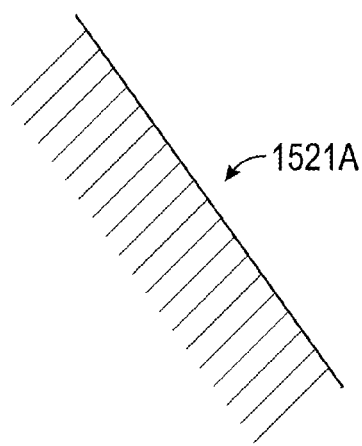

FIGS. 15A-I show top views of parts of some example embodiments of spring guiding profiles that may comprise the spring guiding profile 1321. The deflectable springs are not shown since a variety of deflectable springs may be used with these different spring guiding profiles. FIG. 15A shows a spring guiding profile 1521A that comprises a linear profile.

Figure 15B:
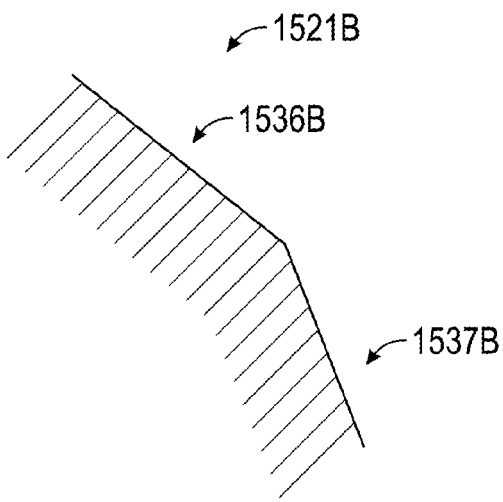
Figure 15C:
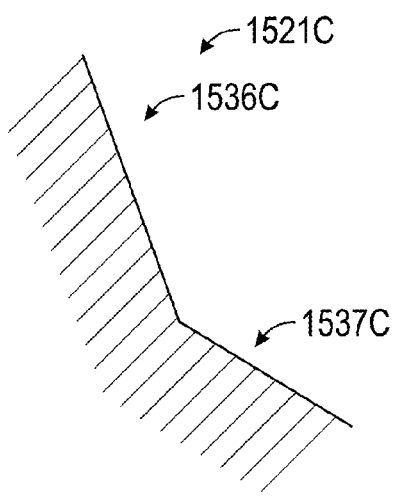

FIG. 15B show a spring guiding profile 1521B that comprises a piecewise linear profile. The spatial rate of change of the deflection of the deflectable spring is higher at the first linear section 1536B, and lower at the second linear section 1537B. Thus, the second spatial rate associated with the second linear section 1537B is lower than the first spatial rate associated with the first linear section 1537B. FIG. 15C show a spring guiding profile 1521C that is also piecewise linear. The spatial rate of change of the deflection of the deflectable spring is lower at the first linear section 1536C, and higher at the second linear section 1537C. Thus, the second spatial rate associated with the second linear section 1537C is faster than the first spatial rate associated with the first linear section 1537C.

Figure 15D:
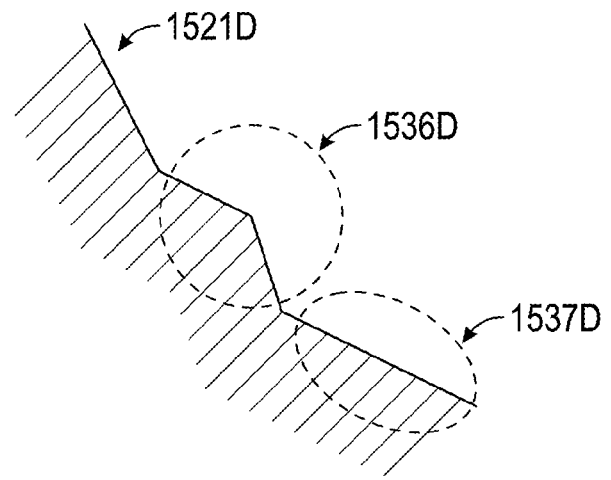
Figure 15E:
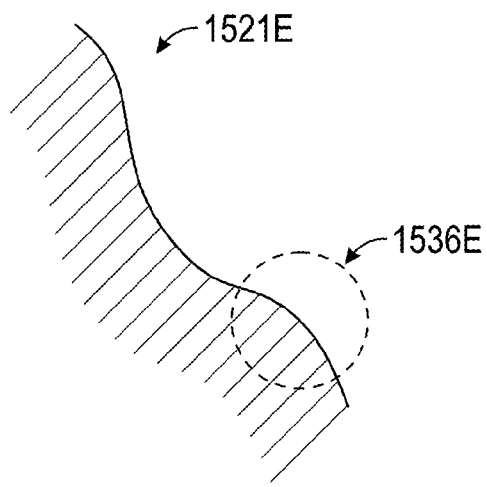
Figure 15F:
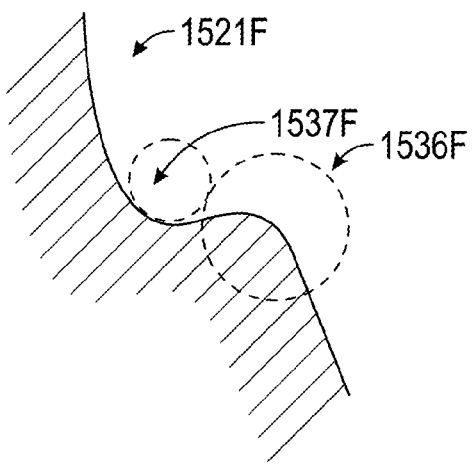
Figure 15G:
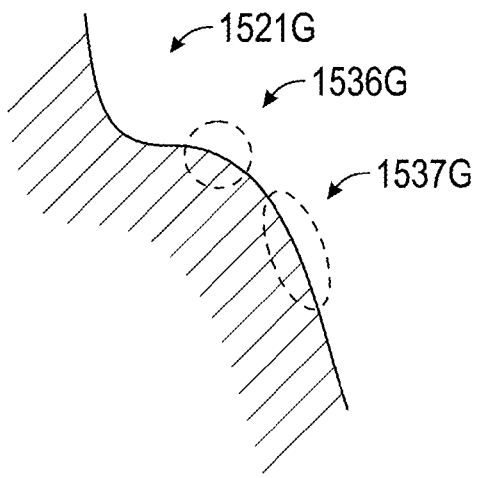
Figure 15H:
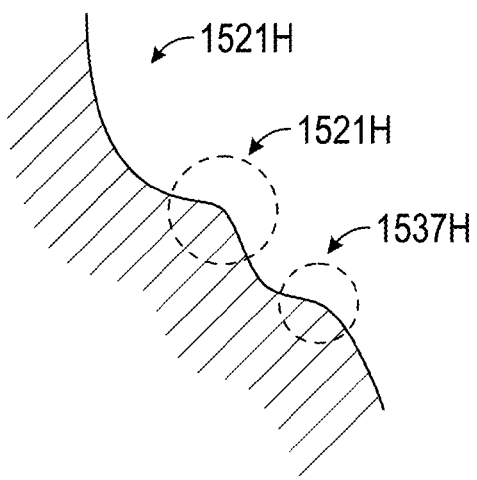
Figure 15I:
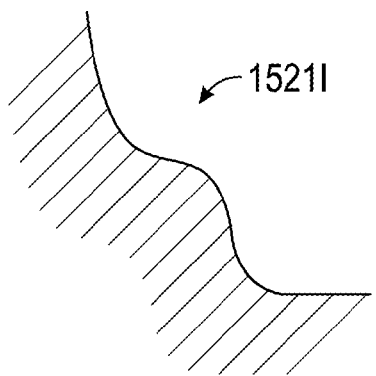

FIG. 15D shows a spring guiding profile 1521D with multiple linear sections extending in a lateral direction. Two dotted circles indicate two lateral extensions 1536D, 1537D. FIG. 15E shows a spring guiding profile 1521E that is stepped with a later extension 1536E, without linear segments. FIG. 15F shows a spring guiding profile 1521F that is also stepped and without linear segments. The lateral extension 1536F is curved to partially surround a region 1537F in which a deflectable spring would interact with the spring guiding profile 1521F. This shape helps to retain the deflectable spring. FIG. 15G shows a spring guiding profile 1521G that has a lateral extension 1536G with a shallower curve when compared with the lateral extension 1536F. The spring guiding profile 1521G also has a rounded side 1537G with variable curvature. FIG. 15H shows a spring guiding profile 1521H with two rounded steps. In normal operation, the two lateral extensions 1536H, 1537H interact with a deflectable spring to cause two regions of increasing force separated by a region of decreased or plateaued force. FIG. 15I shows a spring guiding profile 1522I with a rounded profile with some similarity to the spring guiding profile 1522D. The potentially abrupt changes in force that may arise from sharper transitions associated with piecewise linear profiles are smoothed out. In some embodiments, and depending on the rest of the touchsurface assembly design, this approach also smoothes out the tactile response curve.

As shown, multiple ones of the spring guiding profiles shown in FIGS. 15A-I include spring profiles comprising one or two lateral extensions. Various embodiments may have more or fewer lateral extensions. These lateral extensions extend at least partially in a second lateral orthogonal to the lateral direction travelled by the touchsurface between the unpressed and pressed positions. In various embodiments, these lateral extensions are configured to physically interact with the contact portion at different intermediate keycap positions between the unpressed position and the pressed position.

In various embodiments, the spring guiding profiles or the deflectable springs vary in cross section along their respective depths. Using the touchsurface assembly 1300 as an example, sections of the spring guiding profile 1321 or the deflectable spring 1322 (or both) at different Z heights may differ. These variations over Z add another dimension of control that can be used to define the tactile response curve, provide PTE functionality, and the like.

FIG. 16 show a spring guiding profile 1621 and a deflectable spring 1622 that may be used in various touchsurface assemblies, including the key assembly 500. The spring guiding profile 1621 and the deflectable spring 1622 are configured to contact and interact with each other. They are shown as separate components in FIG. 16 for indicating the section line E-E' for the spring guiding profile 1621 and the section line F-F' for the deflectable spring 1622. FIG. 16 also shows six example cross sections 1691-1696 that may be associated with these sections E-E' and F-F'.

Cross sections 1691, 1692, 1693 show three different profiles that would slope the spring guiding profile 1621 toward the deflectable spring 1622 at the top if the sections 1691, 1692, 1693 are sections E-E' of the spring guiding profile 1621. The same linear profile would slope the deflectable spring 1622 toward the spring guiding profile 1621 if the sections 1691, 1692, 1693 are section F-F' of the deflectable spring 1622. Section 1691 is a linear profile, section 1692 is a concave profile, and section 1693 is a convex profile.

In contrast, cross sections 1696, 1697, 1698 show three different profiles that would slope the spring guiding profile 1621 away from the deflectable spring 1622 at the top if the sections 1696, 1697, 1698 are sections E-E' of the spring guiding profile 1321. The same linear profile would slope the deflectable spring 1622 away from the spring guiding profile 1621 if the sections 1696, 1697, 1698 are sections F-F' of the deflectable spring 1322. Section 1696 is a linear profile, section 1697 is a concave profile, and section 1698 is a convex profile.

Many different variations in cross sections are contemplated, including more complex cross sections with complex curves when shown in sections like those depicted in FIG. 16.

FIG. 17 shows an example method 1700 that can be used for affecting the motion of a pressable touchsurface of a touchsurface assembly. For example, the method 1700 may be practiced with key assembly 500 or some other touchsurface assembly. The pressable touchsurface is configured to move between an unpressed position and a pressed position relative to a base of the key assembly, where the unpressed and pressed positions are separated in a press direction and in a lateral direction orthogonal to the press direction.

Step 1710 comprises providing, in response to a press input to the pressable touchsurface, first reaction forces through physical interactions between different sections of a spring guiding profile and a contact portion that cause different deflections of the deflectable spring. The first reaction forces resist pressable touchsurface motion from an unpressed position to a pressed position. A fixed portion of the deflectable spring and the spring guiding profile are fixed to different key assembly elements selected from group consisting of the base and the pressable touchsurface.

Step 1720 comprises providing, in response to a removal of the press input, second reaction forces through second physical interactions between the spring guiding profile and the contact portion. The second reaction forces bias the keycap toward the unpressed position.

Many variations of the method 1700 are possible. For example, the steps may be in any appropriate order, and need not be in the order shown. As another example, fewer or additional steps may be used. As a specific example of additional steps, method 1700 may be augmented with one or more steps associated with providing additional reaction forces through physical interactions between different sections of a second spring guiding profile and a second contact portion that cause different deflections of a second deflectable spring. As a further example of variations of the method 1700, in some embodiments, the first reaction forces are provided through deformation of a locally deformable section of the deflectable spring that puts the deflectable spring in a release configuration. As yet another example of variations of the method 1700, in some embodiments, the first reaction forces facilitate a snapover tactile response as the pressable touchsurface moves from the unpressed position to the pressed position.

Thus, the techniques described herein can be used to implement any number of devices utilizing different touchsurface assemblies, including a variety of keyboards each comprising one or more key assemblies in accordance with the techniques described herein. For example, some embodiments of keyboards comprises a base, a plurality of key assemblies, and a key sensor. The key sensor is configured to detect pressed states of one or more keycaps of the plurality of key assemblies. At least one key assembly of the plurality of key assemblies comprises a keycap, a first deflectable spring, and a second deflectable spring. The keycap is configured to move between an unpressed position and a pressed position relative to the base, where the unpressed and pressed positions are separated vertically and laterally. The first deflectable spring comprises a first fixed portion and a first contact portion. The first contact portion is configured to contact a first spring guiding profile located proximate to a first edge of the keycap. The first fixed portion and the first spring guiding profile are fixed to different keyboard elements selected from group consisting of the base and the keycap. That is, the first fixed portion is fixed to the base and the first spring guiding profile is fixed to the keycap, or vice versa. The second deflectable spring comprises a second fixed portion and a second contact portion. The second contact portion is configured to contact a second spring guiding profile located proximate to a second edge of the keycap opposite the first edge of the keycap. The second deflectable spring is fixed to the keyboard element to which the first deflectable spring is affixed and the second spring guiding profile is fixed to the keyboard element to which the first spring guiding profile is affixed. That is, the first and second fixed portions are both fixed to the base and the first and second spring guiding profiles are both fixed to the keycap, or vice versa. As the keycap moves from the unpressed position to the pressed position, the first and second contact portions physically interact with first and second different sections of the first and second spring guiding profiles, causing first and second different deflections of the first and second deflectable springs and producing first and second reaction forces, respectively. The first and second reaction forces resist keycap motion toward the pressed position and bias the keycap toward the unpressed position.

In some embodiments, the first and second initial reaction forces produced in response to an initial part of the keycap motion from the unpressed position to the pressed position provide an initial tactile response comprising an increasing resistance. Meanwhile, in some embodiments, first and second subsequent reaction forces produced in response to a subsequent part of the keycap motion from the unpressed position to the pressed position provide a subsequent tactile response comprising a decreasing resistance.

In some embodiments, the first and second reaction forces provide a tactile response comprising a first spatial rate of increasing resistance followed by a second spatial rate of increasing resistance, wherein the second spatial rate is lower than the first spatial rate. In some embodiments, the first and second spring guiding profiles comprise first and second extensions, respectively. In some embodiments, the first and second key guiding profiles each has a corresponding depth, and the first and second key guiding profile each varies in cross section along the corresponding depth. In some embodiments, the first and second deflectable springs comprise first and second locally deformable sections proximate to the first and second contact sections, respectively. In response to an initial part of the keycap motion from the unpressed position to the pressed position, the first and second locally deformable sections deform and put the first and second deflectable springs in first and second release configurations, respectively. In some embodiments, the first locally deformable section and the first contact section comprise a first hook-shaped section of the first deflectable spring, and the second locally deformable section and the second contact section comprise a second hook-shaped section of the second deflectable spring.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions.

Further, it should be understood that the techniques described in the various implementations herein may be used in conjunction with each other, even where the function may seem redundant. For example, some embodiments use springs to back-up or augment the biased arms ready/return mechanisms.

What is claimed is:

1. A key assembly comprising:
   a base;
   a keycap configured to move between an unpressed position and a pressed position relative to the base, wherein the unpressed and pressed positions are separated in a press direction and in a first lateral direction orthogonal to the press direction; and
   a deflectable spring comprising a fixed portion and a contact portion, the contact portion configured to contact a spring guiding profile, wherein the fixed portion and the spring guiding profile are fixed to different key assembly elements selected from group consisting of the base and the keycap,
   wherein, as the keycap moves from the unpressed position to the pressed position, the contact portion physically interacts with different sections of the spring guiding profile, causing different deflections of the deflectable spring and producing reaction forces that resist keycap motion toward the pressed position and bias the keycap toward the unpressed position.

2. The key assembly of claim 1, wherein the fixed portion is fixed to the base, and the spring guiding profile is fixed to the keycap.

3. The key assembly of claim 1, wherein the fixed portion is fixed to the keycap, and the deflectable spring is fixed to the base.

4. The key assembly of claim 1, wherein a same piece of material comprises the deflectable spring and the key assembly element to which the fixed portion of the deflectable spring is fixed.

5. The key assembly of claim 1, wherein the deflectable spring and the key assembly element to which the fixed portion of the deflectable spring is fixed comprise different pieces of material, and wherein the deflectable spring comprises a metal.

6. The key assembly of claim 1, wherein the reaction forces provide a tactile response comprising a first spatial rate of increasing resistance followed by a second spatial rate of increasing resistance, wherein the second spatial rate is lower than the first spatial rate.

7. The key assembly of claim 1, wherein the spring guiding profile comprises a lateral extension extending in a second lateral direction orthogonal to the first lateral direction and the different deflections comprise components in a second lateral direction.

8. The key assembly of claim 1, wherein the key guiding profile has a depth, and the key guiding profile varies in cross section along the depth.

9. The key assembly of claim 1, wherein the spring guiding profile is located proximate to a first edge of the keycap, the key assembly further comprising:
   a second deflectable spring comprising a second fixed portion and a second contact portion, the second contact portion configured to contact a second spring guiding profile located proximate to a second edge of the keycap opposite the first edge of the keycap, wherein the second deflectable spring is fixed to the key assembly element to which the first deflectable spring is affixed and the second spring guiding profile is fixed to the key assembly element to which the first spring guiding profile is affixed,
   wherein, as the keycap moves from the unpressed position to the pressed position, the second contact portion interacts with different sections of the second spring guiding profile, causing second different deflections of the second deflectable spring and producing second reaction forces that resist keycap motion toward the pressed position and bias the keycap toward the unpressed position.

10. The key assembly of claim 1, further comprising:
    a capacitive sensor electrode configured to detect a pressed state of the keycap.

11. The key assembly of claim 1, wherein initial reaction forces produced in response to an initial part of the keycap motion from the unpressed position to the pressed position provide an initial tactile response comprising an increasing resistance.

12. The key assembly of claim 11, wherein subsequent reaction forces produced in response to a subsequent part of the keycap motion from the unpressed position to the pressed position provide a subsequent tactile response comprising a decreasing resistance.

13. The key assembly of claim 1, wherein the deflectable spring comprises a locally deformable portion proximate to the contact portion, and wherein in response to an initial part of the keycap motion from the unpressed position to the pressed position, the locally deformable portion deforms and puts the deflectable spring in a release configuration.

14. The key assembly of claim 13, wherein the locally deformable portion and the contact portion together comprise a hook-shaped section of the deflectable spring.

15. A keyboard comprising:
    a base;
    a plurality of key assemblies, wherein each key assembly of the plurality of key assemblies comprises:
      a keycap configured to move between an unpressed position and a pressed position relative to the base, wherein the unpressed and pressed positions are separated vertically and laterally;
      a first deflectable spring comprising a first fixed portion and a first contact portion, the first contact portion configured to contact a first spring guiding profile located proximate to a first edge of the keycap, wherein the first fixed portion and the first spring guiding profile are fixed to different keyboard elements selected from group consisting of the base and the keycap; and
      a second deflectable spring comprising a second fixed portion and a second contact portion, the second contact portion configured to contact a second spring guiding profile located proximate to a second edge of the keycap opposite the first edge of the keycap, wherein the second deflectable spring is fixed to the keyboard element to which the first deflectable spring is affixed and the second spring guiding profile is fixed to the keyboard element to which the first spring guiding profile is affixed,
      wherein, as the keycap moves from the unpressed position to the pressed position, the first and second contact portions physically interact with first and second different sections of the first and second spring guiding profiles, causing first and second different deflections of the first and second deflectable springs and producing first and second reaction forces, respectively, wherein the first and second reaction forces resist keycap motion toward the pressed position and bias the keycap toward the unpressed position; and
    a key sensor configured to detect pressed states of keycaps of the plurality of key assemblies.

16. The keyboard of claim 15, wherein the first and second deflectable springs of a first key assembly of the plurality of key assemblies are fixed to the keycap of the first key assembly, and the first and second spring guiding profiles of the first key assembly are fixed to the base, and wherein the first and second deflectable springs of a second key assembly of the plurality of key assemblies are fixed to the keycap of the second key assembly, and the first and second spring guiding profiles of the second key assembly are fixed to the base.

17. The keyboard of claim 15, wherein first and second initial reaction forces produced in response to an initial part of the keycap motion from the unpressed position to the pressed position provide an initial tactile response comprising an increasing resistance, and wherein first and second subsequent reaction forces produced in response to a subsequent part of the keycap motion from the unpressed position to the pressed position provide a subsequent tactile response comprising a decreasing resistance.

18. The key assembly of claim 15, wherein the first and second reaction forces provide a tactile response comprising a first spatial rate of increasing resistance followed by a second spatial rate of increasing resistance, wherein the second spatial rate is lower than the first spatial rate.

19. The keyboard of claim 15, wherein for a first key assembly of the plurality of key assemblies, the first and second spring guiding profiles comprise first and second extensions, respectively.

20. The keyboard of claim 15, wherein for a first key assembly of the plurality of key assemblies, the first and second key guiding profiles each has a corresponding depth, and the first and second key guiding profile each varies in cross section along the corresponding depth.

21. The keyboard of claim 15, wherein for a first key assembly of the plurality of key assemblies, the first and second deflectable springs comprise first and second locally deformable sections proximate to the first and second contact sections, respectively, and wherein in response to an initial part of the keycap motion from the unpressed position to the pressed position, the first and second locally deformable sections deform and put the first and second deflectable springs in first and second release configurations, respectively.

22. The keyboard of claim 21, wherein for the first key assembly, the first locally deformable section and the first contact section comprise a first hook-shaped section of the first deflectable spring, and the second locally deformable section and the second contact section comprise a second hook-shaped section of the second deflectable spring.

23. A method of affecting motion of a pressable touchsurface of a touchsurface assembly, wherein the pressable touchsurface is configured to move between an unpressed position and a pressed position relative to a base of the touchsurface assembly, wherein the unpressed and pressed positions are separated in a press direction and in a lateral direction orthogonal to the press direction, the method comprising:
- in response to a press input to the pressable touchsurface, providing first reaction forces that resist pressable touchsurface motion from the unpressed position to the pressed position through physical interactions between different sections of a spring guiding profile and a contact portion that cause different deflections of a deflectable spring, the deflectable spring comprising a fixed portion, wherein the fixed portion and the spring guiding profile are fixed to different touchsurface assembly elements selected from group consisting of the base and the pressable touchsurface; and
- in response to a removal of the press input, providing second reaction forces that bias the pressable touchsurface toward the unpressed position through second physical interactions between the spring guiding profile and the contact portion.

24. The method of claim 23, wherein the providing the first reaction forces comprises:
- providing forces for a snapover response as the pressable touchsurface moves from the unpressed position to the pressed position.

25. The method of claim 23, wherein the providing the first reaction forces comprises:
- providing forces through a deformation of a locally deformable section of the deflectable spring that puts the deflectable spring in a release configuration.

* * * * *